US010256422B2

(12) United States Patent
Schmid et al.

(10) Patent No.: US 10,256,422 B2
(45) Date of Patent: Apr. 9, 2019

(54) ORGANIC ELECTRONIC COMPONENT, USE OF A ZINC COMPLEX AS A P-DOPANT FOR ORGANIC ELECTRONIC MATRIX MATERIALS

(71) Applicant: OSRAM OLED GmbH, Regensburg (DE)

(72) Inventors: Guenter Schmid, Hemhofen (DE); Anna Maltenberger, Leutenbach (DE); Sebastien Pecqueur, La Couture (FR); Florian Kessler, Höchstadt (DE); Stefan Regensburger, Neumarkt (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/515,858

(22) PCT Filed: Sep. 28, 2015

(86) PCT No.: PCT/EP2015/072283
§ 371 (c)(1),
(2) Date: Mar. 30, 2017

(87) PCT Pub. No.: WO2016/050705
PCT Pub. Date: Apr. 7, 2016

(65) Prior Publication Data
US 2017/0301872 A1 Oct. 19, 2017

(30) Foreign Application Priority Data
Sep. 30, 2014 (DE) .......... 10 2014 114 224

(51) Int. Cl.
*H01L 51/50* (2006.01)
*H01L 51/00* (2006.01)

(52) U.S. Cl.
CPC ........ *H01L 51/0092* (2013.01); *H01L 51/009* (2013.01); *H01L 51/5088* (2013.01); *H01L 51/5092* (2013.01); *H01L 51/5024* (2013.01)

(58) Field of Classification Search
None
See application file for complete search history.

(56) References Cited

U.S. PATENT DOCUMENTS

| 4,622,355 A | 11/1986 | Arnold, Jr. et al. |
| 5,247,226 A | 9/1993 | Sato et al. |

(Continued)

FOREIGN PATENT DOCUMENTS

| CN | 101842317 A | 9/2010 |
| CN | 102648540 A | 8/2012 |

(Continued)

OTHER PUBLICATIONS

Clegg, W., et al., "Zinc Carboxylate Complexes: Structural Characterisation of some Binuclear and Linear Trinuclear Complexes," Chem. Soc. Dalton Trans, 1986, pp. 1283-1288.

(Continued)

*Primary Examiner* — Katie L. Hammer
(74) *Attorney, Agent, or Firm* — Slater Matsil, LLP

(57) ABSTRACT

An organic electronic component and a method for making an organic electronic component with a p-dopant are disclosed. In an embodiment, the component includes a matrix containing a zinc complex as a p-dopant, the zinc complex containing at least one ligand L of the following structure: formula (I) wherein $R^1$ and $R^2$ can be oxygen, sulphur, selenium, NH or $NR^4$ independently selected from one another, wherein $R^3$ may comprise alkyl, long-chain alkyl, cycloalkyl, halogen-alkyl, aryl, arylene, halogen-aryl, heteroaryl, heteroarylene, heterocyclic-alkylene, heterocycloalkyl, halogen-heteroaryl, alkenyl, halogen-alkenyl, (Continued)

alkynyl, halogen-alkynyl, ketoaryl, halogen-ketoaryl, ketoheteroaryl, ketoalkyl, halogen-ketoalkyl, ketoalkenyl, halogen-ketoalkenyl, halogen-alkyl-aryl or halogen-alkyl-heteroaryl, and wherein $R^4$ is selected from the group consisting of alkyl and aryl which can be bonded to $R^3$.

17 Claims, 16 Drawing Sheets

(56) References Cited

U.S. PATENT DOCUMENTS

| | | | |
|---|---|---|---|
| 5,858,560 | A | 1/1999 | Nakamura et al. |
| 6,423,429 | B2 | 7/2002 | Kido et al. |
| 6,589,673 | B1 | 7/2003 | Kido et al. |
| 7,632,703 | B2 | 12/2009 | Wu et al. |
| 8,258,501 | B2 | 9/2012 | Werner et al. |
| 8,278,652 | B2 | 10/2012 | Krause et al. |
| 8,314,545 | B2 | 11/2012 | Tsuji et al. |
| 9,276,223 | B2 | 3/2016 | Hartmann et al. |
| 9,437,388 | B2 | 9/2016 | Xu et al. |
| 9,520,575 | B2 | 12/2016 | Lang et al. |
| 9,634,268 | B2 | 4/2017 | Stoessel et al. |
| 2007/0082284 | A1* | 4/2007 | Stoessel ............... C07D 213/26 430/84 |
| 2009/0026929 | A1 | 1/2009 | Song et al. |
| 2010/0213824 | A1* | 8/2010 | Adler ................ C07F 15/0033 313/504 |
| 2010/0243998 | A1 | 9/2010 | Krause et al. |
| 2010/0329964 | A1 | 12/2010 | Roos |
| 2011/0089408 | A1 | 4/2011 | Schmid et al. |
| 2012/0286254 | A1* | 11/2012 | Stoessel ............... H01L 51/0083 257/40 |
| 2013/0200353 | A1 | 8/2013 | Schmid et al. |
| 2015/0123047 | A1 | 5/2015 | Maltenberger et al. |
| 2015/0162534 | A1 | 6/2015 | Maltenberger et al. |

FOREIGN PATENT DOCUMENTS

| | | |
|---|---|---|
| DE | 69408511 T2 | 7/1998 |
| DE | 102007028237 A1 | 12/2008 |
| DE | 102007028236 A1 | 1/2009 |
| DE | 102007037905 A1 | 4/2009 |
| DE | 102010013495 A1 | 10/2011 |
| DE | 102010041331 A1 | 3/2012 |
| DE | 102012209520 A1 | 12/2013 |
| DE | 102012209523 A1 | 12/2013 |
| EP | 0510541 B1 | 12/1995 |
| EP | 1220339 A2 | 7/2002 |
| EP | 1089361 B1 | 3/2014 |
| JP | 2011178755 A | 9/2011 |
| JP | 2014504454 A | 2/2014 |
| WO | 2005086251 A2 | 9/2005 |
| WO | 2006137640 A1 | 12/2006 |
| WO | 2008154915 A1 | 12/2008 |
| WO | 2008155310 A1 | 12/2008 |
| WO | 2009056626 A1 | 5/2009 |
| WO | 2011033023 A1 | 3/2011 |
| WO | 2011066898 A1 | 6/2011 |
| WO | 2013182389 A2 | 12/2013 |

OTHER PUBLICATIONS

Clegg, W., et al., "Zinc Carboxylate Complexes: Structural Characterization of the Mixed-Metal Linear Trinuclear Complexes MZn2 (crot)6(base)2 (M = Mn, Co, Ni, Zn, Cd, Mg, Ca, Sr; crot = Crotonate(1-); Base = Quinoline, 6-Methylquinoline)," Inorg. Chem., 1988, pp. 1916-1921.

Orchard, K., et al., "Pentanuclear Complexes for a Series of Alkylzinc Carboxylates," Organometallics Article, 2009 p. 5828-5832.

Schmid, G., et al., "Fluorinated Copper (I) Carboxylates as Advanced Tunable p-Dopants for Organic Light-Emitting Diodes," Advanced Materials, vol. 26, Issue 6, Feb. 12, 2014, pp. 878-885.

Zelenak, V., et al., "Preparation, characterisation and crystal structure of two zinc(II) benzoate complexes with pyridine-based ligands nicotinamide and methyl-3-pyridylcarbamate," Inorganica Chimica Ada 357, pp. 2049-2059, 2004.

WU, Q. et al., "Blue-Luminescent/Electroluminescent Zn(II) Compounds of 7-Azaindole and N-(2-Pyridyl)-7-azaindole: Zn(7-azaindole)2(CH3COO)2, Zn(NPA)(CH3COO)2, and Zn(NPA)((S)-(+)-CH3CH2CH(CH3)cOO)2 (NPA = N-(2-yridyl)-7-azaindole)," Inorganic Chemistry, vol. 39, No. 23, Nov. 13, 2000, 7 pages.

* cited by examiner

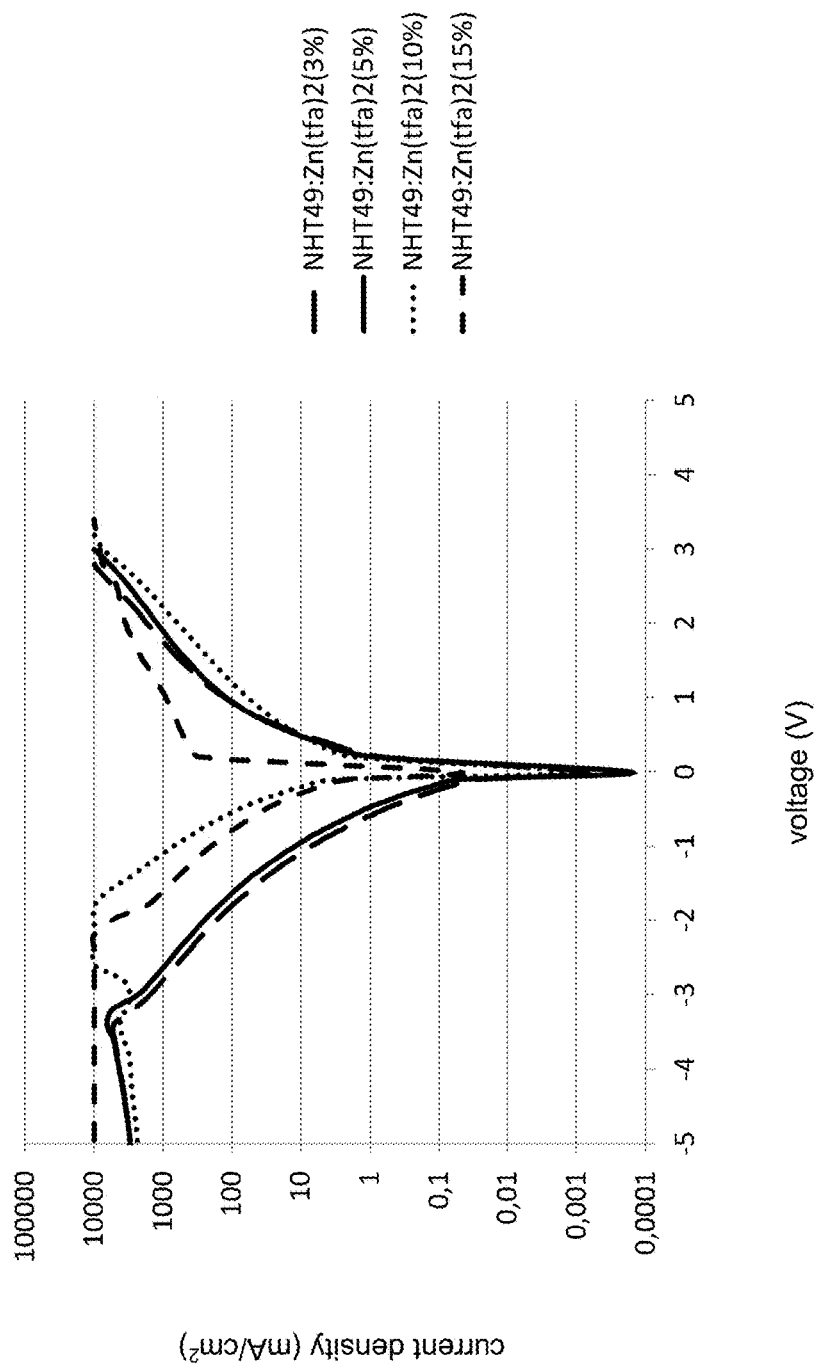

FIG 13B

| | conc. [Vol%] | L [cd/m²] | Peff [lm/W] | Ieff [cd/A] | EQE [%] | Cx | Cy | U [V] | I [mA/cm²] |
|---|---|---|---|---|---|---|---|---|---|
| NHT49:NDP9 | 6 | 2100 | 3,0 | 5,1 | 12,4 | 0,699 | 0,300 | 5,4 | 42 |
| NHT49:Zn(tfa) | 3 | 2100 | 3,2 | 5,4 | 13,4 | 0,699 | 0,299 | 5,4 | 40 |
| NHT49:Zn(tfa) | 5 | 2100 | 3,2 | 5,5 | 13,5 | 0,699 | 0,299 | 5,3 | 40 |
| NHT49:Zn(tfa) | 10 | 2100 | 3,1 | 5,5 | 13,5 | 0,699 | 0,299 | 5,6 | 40 |
| NHT49:Zn(tfa) | 15 | 2100 | 2,9 | 4,9 | 11,9 | 0,699 | 0,299 | 5,4 | 44 |

ORGANIC ELECTRONIC COMPONENT, USE OF A ZINC COMPLEX AS A P-DOPANT FOR ORGANIC ELECTRONIC MATRIX MATERIALS

This patent application is a national phase filing under section 371 of PCT/EP2015/072283, filed Sep. 28, 2015, which claims the priority of German patent application 10 2014 114 224.1, filed Sep. 30, 2014, each of which is incorporated herein by reference in its entirety.

TECHNICAL FIELD

The invention relates to the use of zinc complexes as p-dopants for organic electronic matrix materials.

BACKGROUND

Within the field or organic electronics, it is possible to identify essentially two key commercial fields of technology. The first field of technology concerns applications of organic matrix materials for converting light into electrical power, and, conversely, the other field focuses on the construction of electrical components by means of organic semiconductor material. Examples of the first-mentioned category include, for example, photodetectors and organic solar cells, schematically illustrated in FIG. 1, which convert light into an electrical signal or into electrical power, and organic light-emitting diodes (OLEDs), which can generate light by means of organic electronic materials (see FIG. 2). For example, the second field of technology includes organic field-effect transistors, schematically illustrated in FIG. 3, in which a doping reduces the contact resistance between electrode and semiconductor material, or bipolar transistors, which are described in greater detail by way of example in DE 10 2010 041 331 A1.

What is common to all applications is the fact that they include electrical transport layers as essential functional component, which transport layers have different conduction mechanisms depending on their composition. Generally, a distinction is made between an intrinsic p-(hole) conductivity and an n-(electron) conductivity of the organic materials. Since the electrical properties of these organic substance classes are often inadequate for an efficient use of the components, they are combined with additional compounds, which are intended to improve the electrical properties of the layers. This is usually implemented by doping with metal or further organic compounds. One approach for attaining significant improvements of the conductivities is the addition of metal complexes.

For example, WO 2005 086251 A2 describes dopants for the production of n-conductive layers which, inter alia, can also have the following structure:

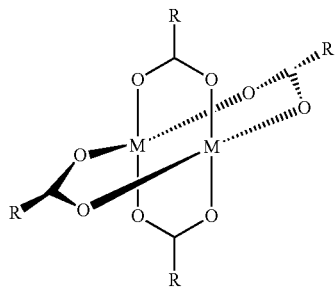

The structure of this compound class is also referred to in the literature as a "paddle wheel complex". In particular, the publication describes the use of a metal complex as n-dopant for doping an organic semi-conductive matrix material in order to change the electrical properties thereof. The presented compounds are intended to be usable as n-dopants in respect of the matrix material.

DE 10 2012 209 520 A1 claims metal complexes of groups 5-7 as p-dopants for organic electronic components and in this regard describes complex compounds which are based on chromium and molybdenum and which, as binuclear metal complexes, form a paddle wheel structure.

The dirhodium tetra(trifluoroacetate) complex presented as an example of a rhodium-based p-dopant in WO 2008/154915 A1 is also based on a paddle wheel structure.

WO 2013/182389 A2 describes the use of metal complexes of groups 13 to 15 as p-dopants. Here, in particular bismuth complexes with bismuth in the oxidation stages III and V are presented. The shown complexes each have just one individual central atom.

WO 2011/033023 A1 describes copper complexes, particularly Cu(I) complexes, as p-dopants, which can be polynuclear. Polynuclear copper complexes are always characterized here by an even number of copper atoms, for example, 2, 4 or 6 copper atoms.

SUMMARY OF THE INVENTION

Embodiments provide materials which are suitable as p-dopants in organic electronic matrix materials, in particular hole transporters, and which increase the efficiency of components containing these layers.

According to embodiments, an organic electronic component having a matrix is proposed, wherein the matrix contains a zinc complex as p-dopant, which zinc complex in turn contains at least one ligand L of the following structure:

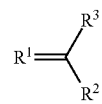

wherein $R^1$ and $R^2$ can be oxygen, sulfur, selenium, NH or $NR^4$ independently from one another, wherein $R^4$ is selected from the group comprising alkyl or aryl and can be bonded to $R^3$; and $R^3$ is selected from the group comprising alkyl, long-chain alkyl, cycloalkyl, haloalkyl, aryl, arylene, haloaryl, heteroaryl, heteroarylene, heterocycloalkylene, heterocycloalkyl, haloheteroaryl, alkenyl, haloalkenyl, alkinyl, haloalkinyl, ketoaryl, haloketoaryl, ketoheteroaryl, ketoalkyl, haloketoalkyl, ketoalkenyl, haloketoalkenyl, haloalkylaryl, haloalkylheteroaryl, wherein, for suitable groups, one or more non-adjacent $CH_2$ groups can be replaced by —O—, —S—, —NH—, —$NR^{\circ\circ\circ}$—, —$SiR^{\circ}R^{\circ\circ}$—, —CO—, —COO—, —$COR^{\circ}OR^{\circ\circ}$—, —OCO—, —OCO—O—, —$SO_2$—, —S—CO—, —CO—S—, —O—CS—, —CS—O—, —CY1=CY2 or —C≡C-independently from one another, and in such a way that O and/or S atoms are not directly bonded to one another, and are replaced optionally with aryl or heteroaryl preferably containing 1 to 30 C atoms (terminal $CH_3$ groups are understood to be $CH_2$ groups in the sense of $CH_2$—H).

$R^{\circ}$, $R^{\circ\circ}$, Y1 and Y2 by way of example can each be selected from the group consisting of hydrogen, alkyl or aryl independently from one another. $R^{\circ\circ\circ}$ by way of example can be selected from the group consisting of alkyl and aryl.

It has surprisingly been found that zinc complexes of the described form can be used as p-dopants for matrix materials in organic electronic components.

The inventors of the present invention have identified that zinc complexes of the described form allow a much higher diversity in their structures compared to conventional metal complexes, used for p-doping, of the aforementioned metal atoms (groups 5-7 and 13-15 of the periodic table of elements and also Cu etc.) with the ligand L.

Some examples of zinc complexes are shown in FIGS. 5 to 8.

By way of example, mononuclear and polynuclear complexes can be formed equally with zinc. For example, polynuclear complexes of zinc with the above-described ligands are limited neither to paddle wheel structures nor to an even number of metal centers. A diversity of this type of the structures has not been observed with any of the previously examined combinations of metal atoms with ligands of the described form (ligand L).

The inventors have found that this diversity of zinc complexes leads to particularly suitable p-dopants for matrix materials in organic electronic components.

Surprisingly, it is possible with the zinc complexes according to the invention to set the doping strength in the matrix of organic electronic components largely independently of the sublimation temperature of the zinc complex. A clear decoupling of this type of doping strength and sublimation temperature of the metal complex is characteristic for the zinc complexes according to the invention.

The doping strength can thus also be adapted more easily to the particular matrix than in the case of many conventional dopants. In addition, the described materials can be easily produced and do not require complex production methods. The zinc complexes are additionally easily separated from various sources with the matrix material by means of co-evaporation, such that doped matrix layers having a well-defined composition are formed, wherein the conductivity can be adapted to the respective requirements via the concentration of the dopant.

Reference will be made briefly hereinafter to a number of term definitions:

Within the sense of the present invention, the term "hydrogen" is not limited solely to hydrogen ($^{1}H$), but in particular also includes all further isotopes of hydrogen, in particular deuterium ($^{2}H$ or D).

Within the sense of the present invention, the term "organic electronic component" means and/or includes in particular organic transistors, organic light-emitting diodes, light-emitting electrochemical cells, organic solar cells, photodiodes, and organic photovoltaics in general.

Within the sense of the present invention, the term "p-dopant" in particular includes or means materials that have a Lewis acidity and/or are capable of forming complexes with the matrix material in which said materials act (even if only formally) as Lewis acids.

A zinc complex matrix material (hole conductor) of this type can have the following structure, for example:

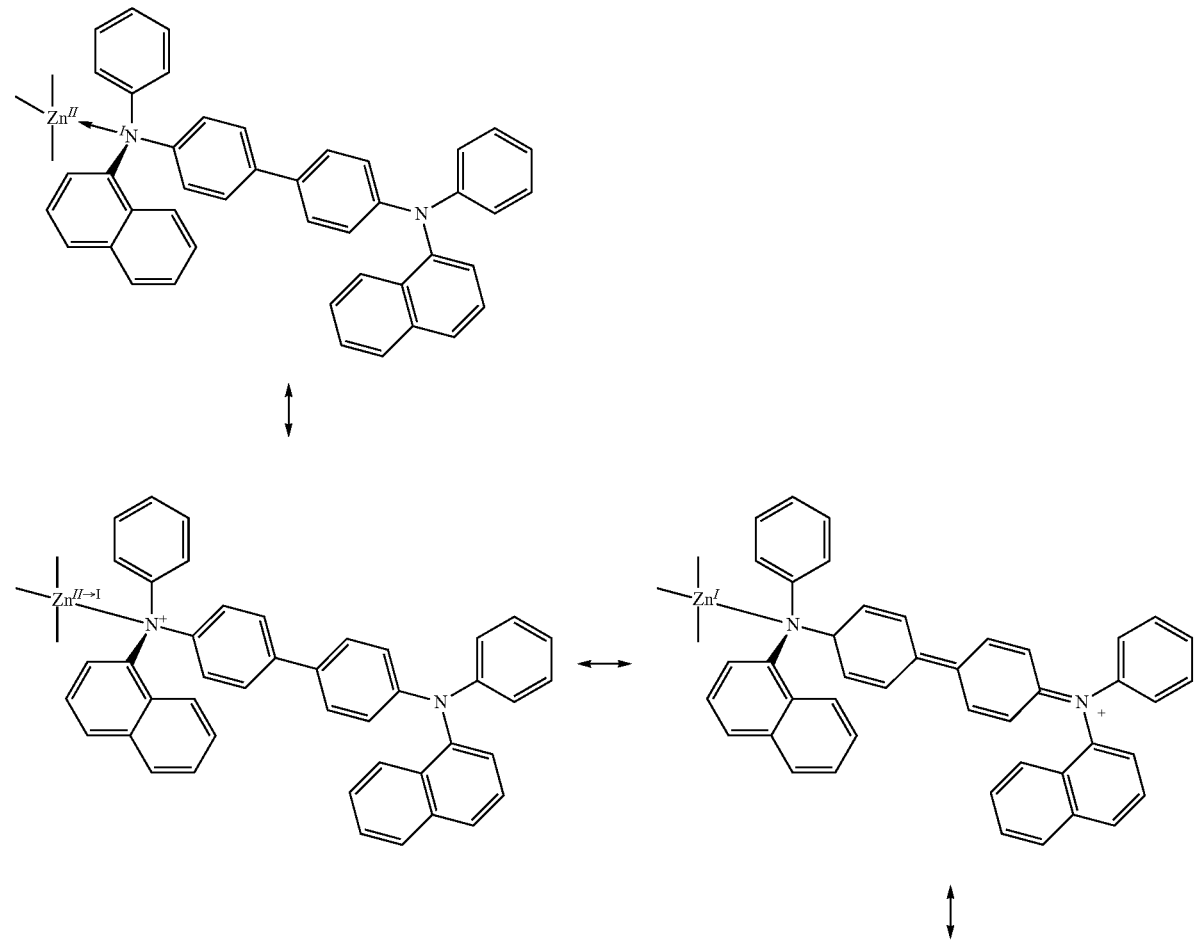

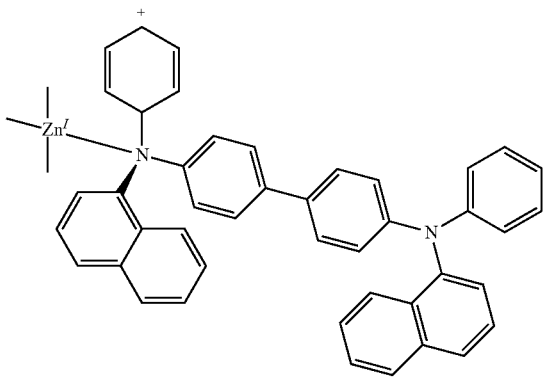

What is shown here (by way of example) is the hole generation and the delocalization of the positive charge with use of NPB (N,N'-bis(naphthalen-1-yl)-N,N'-bis(phenyl)-benzidine). Here, only the zinc central atom in the zinc complex is shown for reasons of simplicity. The number of the mesomeric boundary structures is much higher than that of the shown mesomeric boundary structures. There is no illustration provided of all boundary structures, merely due to a lack of space.

Charges can pass via "hopping" from one hole transport molecule to the next. Conductivity paths are helpful for the charge transport, but are not necessary.

General group definition: within the description and the claims, general groups such as alkyl, alkoxy, aryl etc. are claimed and described. Unless described otherwise, the following groups within the generally described groups are preferably used within the scope of the present invention:

alkyl: linear and branched C1-C8-alkyls,
long-chain alkyls: linear and branched C5-C20-alkyls,
alkenyl: C2-C6-alkenyl,
cycloalkyl: C3-C8-cycloalkyl, additionally adamantyl and decahydronaphthyl
alkylenes: selected from the group comprising:
methylene; 1,1-ethylene; 1,2-ethylene; 1,1-propylidene; 1,2-propylene; 1,3-propylene; 2,2-propylidene; butan-2-ol-1,4-diyl; propan-2-ol-1,3-diyl; 1,4-butylene; cyclohexane-1,1-diyl; cyclohexane-1,2-diyl; cyclohexane-1,3-diyl; cyclohexane-1,4-diyl; cyclopentane-1,1-diyl; cyclopentane-1,2-diyl; and cyclopentane-1,3-diyl,
aryl: selected from aromatic compounds with a molecular weight of less than 300 Da.
arylenes: selected from the group comprising: 1,2-phenylene; 1,3-phenylene; 1,4-phenylene; 1,2-naphthylene; 1,3-naphthalenylene; 1,4-naphthylene; 2,3-naphthylene; 1-hydroxy-2,3-phenylene; 1-hydroxy-2,4-phenylene; 1-hydroxy-2,5-phenylene; and 1-hydroxy-2,6-phenylene,
heteroaryl: selected from the group comprising: pyridinyl; pyrimidinyl; pyrazinyl; triazolyl; pyridazinyl; 1,3,5-triazinyl; quinoninyl; isoquinoninyl; quinoxalinyl; imidazolyl; pyrazolyl; benzimidazolyl; thiazolyl; oxazolidinyl; pyrrolyl; thiophenyl; carbazolyl; indolyl; and isoindolyl, wherein the heteroaryl may be bonded to the compound via any atom in the ring of the selected heteroaryl.
heteroarylenes: selected from the group comprising: pyridindiyl; quinolindiyl; pyrazodiyl; pyrazoldiyl; triazolediyl; pyrazindiyl, thiophendiyl; and imidazolediyl, wherein the heteroarylene acts as a bridge in the compound over any atom in the ring of the selected heteroaryl, particularly preferred are: pyridine-2,3-diyl; pyridine-2,4-diyl; pyridine-2,5-diyl; pyridine-2,6-diyl; pyridine-3,4-diyl; pyridine-3,5-diyl; quinoline-2,3-diyl; quinoline-2,4-diyl; quinoline-2,8-diyl; isoquinoline-1,3-diyl; isoquinoline-1,4-diyl; pyrazole-1,3-diyl; pyrazole-3,5-diyl; triazole-3,5-diyl; triazole-1,3-diyl; pyrazine-2,5-diyl; and imidazole-2,4-diyl, thiophene-2,5-diyl, thiophene-3,5-diyl; a Cl-C6-heterocycloalkyl, selected from the group comprising: piperidinyl; piperidine; 1,4-piperazine, tetrahydrothiophene; tetrahydrofuran; 1,4,7-triazacyclononane; 1,4,8,11-tetraazacyclotetradecane; 1,4,7,10,13-pentaazacyclopentadecane; 1,4-diaza-7-thia-cyclononane; 1,4-diaza-7-oxa-cyclononane; 1,4,7,10-tetraazacyclododecane; 1,4-dioxane; 1,4,7-trithia-cyclononane; pyrrolidine; and tetrahydropyran, wherein the heteroaryl may be bonded to the C1-C6-alkyl via any atom in the ring of the selected heteroaryl.

heterocycloalkylenes: selected from the group comprising: piperidin-1,2-ylene; piperidin-2,6-ylene; piperidin-4,4-ylidene; 1,4-piperazin-1,4-ylene; 1,4-piperazin-2,3-ylene; 1,4-piperazin-2,5-ylene; 1,4-piperazin-2,6-ylene; 1,4-piperazin-1,2-ylene; 1,4-piperazin-1,3-ylene; 1,4-piperazin-1,4-ylene; tetrahydrothiophen-2,5-ylene; tetrahydrothiophen-3,4-ylene; tetrahydrothiophen-2,3-ylene; tetrahydrofuran-2,5-ylene; tetrahydrofuran-3,4-ylene; tetrahydrofuran-2,3-ylene; pyrrolidin-2,5-ylene; pyrrolidin-3,4-ylene; pyrrolidin-2,3-ylene; pyrrolidin-1,2-ylene; pyrrolidin-1,3-ylene; pyrrolidin-2,2-ylidene; 1,4,7-triazacyclonon-1,4-ylene; 1,4,7-triazacyclonon-2,3-ylene; 1,4,7-triazacyclonon-2,9-ylene; 1,4,7-triazacyclonon-3,8-ylene; 1,4,7-triazacyclonon-2,2-ylidene; 1,4,8,11-tetraazacyclotetradec-1,4-ylene; 1,4,8,11-tetraazacyclotetradec-1,8-ylene; 1,4,8,11-tetraazacyclotetradec-2,3-ylene; 1,4,8,11-tetraazacyclotetradec-2,5-ylene; 1,4,8,11-tetraazacyclotetradec-1,2-ylene; 1,4,8,11-tetraazacyclotetradec-2,2-ylidene; 1,4,7,10-tetraazacyclododec-1,4-ylene; 1,4,7,10-tetraazacyclododec-1,7-ylene; 1,4,7,10-tetraazacyclododec-1,2-ylene; 1,4,7,10-tetraazacyclododec-2,3-ylene; 1,4,7,10-tetraazacyclododec-2,2-ylidene; 1,4,7,10,13 pentaazacyclopentadec-1,4-ylene; 1,4,7,10,13-pentaazacyclopentadec-1,7-ylene; 1,4,7,10,13-pentaazacyclopentadec-2,3-ylene; 1,4,7,10,13-pentaazacyclopentadec-1,2-ylene; 1,4,7,10,13-pentaazacyclopentadec-2,2-ylidene; 1,4-diaza-7-thia-cyclonon-1,4-ylene; 1,4-diaza-7-thia-cyclonon-1,2-ylene; 1,4-diaza-7thia-cyclonon-2,3-ylene; 1,4-diaza-7-thia-cyclonon-6,8-ylene; 1,4-diaza-7-thia-cyclonon-2,2-ylidene; 1,4-diaza-7-oxacyclonon-1,4-ylene; 1,4-diaza-7-oxa-cyclonon-1,2-ylene; 1,4diaza-7-oxa-cyclonon-2,3-ylene; 1,4-diaza-7-oxa-cyclonon-6,8-ylene; 1,4-diaza-7-oxa-cyclonon-2,2-ylidene; 1,4-dioxan-2,3-ylene; 1,4-dioxan-2,6-ylene; 1,4-dioxan-2,2-ylidene; tetrahydropyran-2,3-ylene; tetrahydropyran-2,6-ylene; tetrahydropyran- 2,5-ylene; tetrahydropyran-2,2-ylidene; 1,4,7-trithia-cyclonon-2,3-ylene; 1,4,7-trithia-cyclonon-2,9-ylene; and 1,4,7-trithia-cyclonon-2,2-ylidene, heterocycloalkyl: selected from the group comprising: pyrrolinyl; pyrrolidinyl; morpholinyl; piperidinyl; piperazinyl; hexamethylene imine; 1,4-piperazinyl; tetrahydrothiophenyl; tetrahydrofuranyl; 1,4,7-triazacyclononanyl; 1,4,8,11-tetraazacyclotetradecanyl; 1,4,7,10,13-pentaazacyclopentadecanyl; 1,4-diaza-7-thiacyclononanyl; 1,4-diaza-7-oxa-cyclononanyl; 1,4,7,10-tetraazacyclododecanyl; 1,4-dioxanyl; 1,4,7-trithiacyclononanyl; tetrahydropyranyl; and oxazolidinyl, wherein the heterocycloalkyl may be bonded to the compound via any atom in the ring of the selected heterocycloalkyl.

amines: the group —N(R)2 wherein each R is independently selected from: hydrogen; C1-C6-alkyl; C1-C6-alkyl-C6H5; and phenyl, wherein if both R' are C1-C6 alkyl, both R' can form a —NC3 to NC5 heterocyclic ring, wherein the remaining alkyl chain forms alkyl substituents on the heterocyclic ring.

halogen: selected from the group comprising: F; Cl; Br and I haloalkyl: selected from the group comprising mono, di, tri-, poly- and perhalogenated linear and branched C1-C8-alkyl, particularly preferably —CF$_3$ pseudohalogen: selected from the group comprising —CN, —SCN, —OCN, N3, —CNO and —SeCN carboxylate: the group —C(O)OR, wherein R is selected from: hydrogen; C1-C6-alkyl; phenyl; C1-C6-alkyl-C6H5;

carbonyl: the group —C(O)R, wherein R is selected from: hydrogen; C1-C6 alkyl; phenyl; C1-C6 alkyl-C6H5 and amines selected from the group: —NR'2, wherein each R' is independently selected from: hydrogen; C1-C6-alkyl; C1-C6-alkyl-C6H5; and phenyl, wherein if both R' are C1-C6 alkyl, both R' can form a —NC3 to NC5 heterocyclic ring, wherein the remaining alkyl chain forms alkyl substituents on the heterocyclic ring.

Unless mentioned otherwise, the following groups are more preferred groups within the general group definition:

alkyl: linear and branched C1-C6-alkyl, long-chain alkyls: linear and branched C5-C10-alkyl, preferably C6-C8 alkyls alkenyl: C3-C6-alkenyl, cycloalkyl: C6-C8-cycloalkyl, alkylenes: selected from the group comprising: methylene; 1,2-ethylene; 1,3-propylene; butan-2-ol-1,4-diyl; 1,4-butylene; cyclohexane-1,1-diyl; cyclohexane-1,2-diyl; cyclohexane-1,4-diyl; cyclopentane-1,1-diyl; and cyclopentane-1,2-diyl, aryl: selected from the group comprising: phenyl; biphenyl; naphthalenyl; anthracenyl; and phenanthrenyl, arylenes: selected from the group comprising: 1,2-phenylene; 1,3-phenylene; 1,4-phenylene; 1,2-naphthylene; 1,4-naphtalenylene; 2,3-naphthylene and 1-hydroxy-2,6-phenylene, heteroaryl: selected from the group comprising: pyridinyl; pyrimidinyl; quinoninyl; pyrazolyl; triazolyl; isoquinoninyl; imidazolyl; and oxazolidinyl, wherein the heteroaryl may be bonded to the compound via any atom in the ring of the selected heteroaryl, heteroarylenes: selected from the group comprising: pyridine 2,3-diyl; pyridine-2,4-diyl; pyridine-2,6-diyl; pyridine-3,5-diyl; quinoline-2,3-diyl; quinoline-2,4-diyl; isoquinoline-1,3-diyl; isoquinoline-1,4-diyl; pyrazole-3,5-diyl; and imidazole-2,4-diyl, heterocycloalkyl: selected from the group comprising: pyrrolidinyl; morpholinyl; piperidinyl; piperidinyl; 1,4-piperazinyl; tetrahydrofuranyl; 1,4,7-triazacyclononanyl; 1,4,8,11-tetraazacyclotetradecanyl; 1,4,7,10,13-pentaazacyclopentadecanyl; 1,4,7,10-tetraazacyclododecanyl; and piperazinyl, wherein the heteroaryl may be bonded to the compound via any atom in the ring of the selected heteroaryl heterocycloalkylene: selected from the group comprising: piperidin-2,6-ylene; piperidin-4,4-ylidene; 1,4-piperazin-1,4-ylene; 1,4-piperazin-2,3-ylene; 1,4-piperazin-2,6-ylene; tetrahydrothiophen-2,5-ylene; tetrahydrothiophen-3,4-ylene; tetrahydrofuran-2,5-ylene; tetrahydrofuran-3,4-ylene; pyrrolidin-2,5-ylene; pyrrolidin-2,2-ylidene; 1,4,7-triazacyclonon-1,4-ylene; 1,4,7-triazacyclonon-2,3-ylene; 1,4,7-triazacyclonon-2,2-ylidene; 1,4,8,11-tetraazacyclotetradec-1,4-ylene; 1,4,8,11-tetraazacyclotetradec-1,8-ylene; 1,4,8,11-tetraazacyclotetradec-2,3-ylene; 1,4,8,11-tetraazacyclotetradec-2,2-ylidene; 1,4,7,10-tetraazacyclododec-1,4-ylene; 1,4,7,10-tetraazacyclododec-1,7-ylene; 1,4,7,10-tetraazacyclododec-2,3-ylene; 1,4,7,10-tetraazacyclododec-2,2-ylidene; 1,4,7,10,13-pentaazacyclopentadec-1,4-ylene; 1,4,7,10,13-pentaazacyclopentadec-1,7-ylene; 1,4-diaza-7-thia-cyclonon-1,4 ylene; 1,4-diaza-7-thia-cyclonon-2,3-ylene; 1,4-diaza-7-thien cyclonon-2,2-ylidene; 1,4-diaza-7-oxa-cyclonon-1,4-ylene; 1,4 diaza-7-oxa-cyclonon-2,3-ylene;1,4-diaza-7-oxa-cyclonon-2,2-ylidene; 1,4-dioxan-2,6-ylene; 1,4-dioxan-2,2-ylidene; tetrahydropyran-2,6-ylene; tetrahydropyran-2,5-ylene; und tetrahydropyran-2,2-ylidene, a -C1-C6-alkyl-heterocycloalkyl, wherein the heterocycloalkyl is selected from the group consisting of: piperidinyl; 1,4-piperazinyl; tetrahydrofuranyl; 1,4,7-triazacyclononanyl; 1,4,8,11-tetraazacyclotetradecanyl; 1,4,7,10,13-pentaazacyclopentadecanyl; 1,4,7,10-tetraazacyclododecanyl; and pyrrolidinyl, wherein the heterocycloalkyl may be bonded to the compound via any atom in the ring of the selected heterocycloalkyl amine: the group —N(R)2, wherein each R is independently selected from: hydrogen; C1-C6-alkyl; and benzyl, halogen: selected from the group comprising: F and Cl, carboxylate: the group —C(O)OR, wherein R is selected from hydrogen; C1-C6-alkyl; and benzyl, carbonyl: the group: —C(O)R, wherein R is selected from: hydrogen; C1-C6-alkyl; benzyl and amines selected from the group: —NR'2, wherein each R' is independently selected from: hydrogen; C1-C6-alkyl; and benzyl, In accordance with a preferred embodiment of the invention R$^3$ is haloalkyl, particularly preferably perfluoroalkyl with 1 to 8 carbons, more preferably 1 to 4, haloaryl, particularly preferably perfluoroaryl, haloalkylaryl, particularly preferably (per)fluoroalkylaryl and haloheteroaryl, particularly preferably perfluoroheteroaryl.

Furthermore, the following are specified as preferred examples of the ligand L: fluorinated benzoic acids, such as 2-(trifluoromethyl)benzoic acid; 3,5-difluorobenzoic acid; 3-hydroxy-2,4,6-triiodobenzoic acid; 3-fluoro-4-methylbenzoic acid; 3-(trifluoromethoxy)benzoic acid; 4-(trifluoromethoxy)benzoic acid; 4-chloro-2,5-difluorobenzoic acid; 2-chloro-4,5-difluorobenzoic acid; 2,4,5-trifluorobenzoic acid; 2-fluorobenzoic acid; 4-fluorobenzoic acid; 2,3,4-trifluorobenzoic acid; 2,3,5-trifluorobenzoic acid; 2,3-difluorobenzoic acid; 2,4-bis(trifluoromethyl)benzoic acid; 2,4-difluorobenzoic acid; 2,5-difluorobenzoic acid; 2,6-bis(trifluoromethyl)benzoic acid; 2,6-difluorobenzoic acid; 2-chloro-6-fluorobenzoic acid; 2-fluoro-4-(trifluoromethyl) benzoic acid; 2-fluoro-5-(trifluoromethyebenzoic acid; 2-fluoro-6-(trifluoromethyl)benzoic acid; 3,4,5-trifluorobenzoic acid; 3,4-difluorobenzoic acid; 3,5-bis(trifluoromethyl) benzoic acid; 3-(trifluoromethyebenzoic acid; 3-chloro-4- fluorobenzoic acid; 3-fluoro-5-(trifluoromethyl)benzoic acid; 3-fluorobenzoic acid; 4-fluoro-2-(trifluoromethyl)benzoic acid; 4-fluoro-3-(trifluoromethyl)benzoic acid; 5-fluoro-2-methylbenzoic acid; 2-(trifluoromethoxy)benzoic acid; 2,3,5-trichlorobenzoic acid; 4-(trifluoromethyl)benzoic acid; pentafluorobenzoic acid; 2,3,4,5-tetrafluorobenzoic acid, fluorinated or non-fluorinated phenylacetic acid, such as 2-fluoro-phenylacetic acid; 3-fluoro-phenylacetic acid; 4-fluoro-phenylacetic acid; 2,3-difluoro-phenylacetic acid; 2,4-difluoro-phenylacetic acid; 2,6-difluoro-phenylacetic acid; 3,4-difluoro-phenylacetic acid; 3,5-difluoro-phenylacetic acid; pentafluoro-phenylacetic acid; 2-chloro-6-fluoro-phenylacetic acid; 2-chloro-3,6-difluoro-phenylacetic acid; 3-chloro-2,6-difluoro-phenylacetic acid; 3-chloro-4-fluoro-phenylacetic acid; 5-chloro-2-fluoro-phenylacetic acid; 2,3,4-trifluoro-phenylacetic acid; 2,3,5-trifluoro-phenylacetic acid; 2,3,6-trifluoro-phenylacetic acid; 2,4,5-trifluoro-phenylacetic acid; 2,4,6-trifluoro-phenylacetic acid; 3,4,5-trifluoro-phenylacetic acid; 3-chloro-2-fluoro-phenylacetic acid; α-fluoro-phenylacetic acid; 4-chloro-2-fluoro-phenylacetic acid; 2-chloro-4-fluoro-phenylacetic acid; α,α-difluoro-phenylacetic acid; ethyl 2,2-difluoro-2-phenylacetate; and fluorinated or non-fluorinated acetic acid, such as methyl-trifluoroacetate; allyl-trifluoroacetate; ethyl-trifluoroacetate; isopropyl-trifluoroacetate; 2,2,2-trifluoroethyl-trifluoroacetate; difluoroacetic acid; trifluoroacetic acid; methyl-chlorodifluoroacetate; ethyl-bromodifluoroacetate; chlorodifluoroacetic acid; ethyl-chlorofluoroacetate; ethyl-difluoroacetate; (3-chlorophenye-difluoroacetic acid; (3,5-difluorophenyl)-difluoroacetic acid; (4-butylphenyl)difluoroacetic acid; (4-tert-butylphenyl)difluoroacetic acid; (3,4-dimethylphenyl)-difluoroacetic acid; (3-chloro-4-fluorophenyl)-difluoroacetic acid; (4-chlorophenye-difluoroacetic acid; 2-biphenyl-3',5'-difluoroacetic acid; 3-biphenyl-3',5'-difluoroacetic acid; 4-biphenyl-3',5'-difluoroacetic acid; 2-biphenyl-3',4'-difluoroacetic acid; 3-biphenyl-3',4'-difluoroacetic acid; 4-biphenyl-3',4'-difluoroacetic acid and 2,2-difluoro-propionic acid or higher homologs thereof. If the ligands L comprise acid groups, the groups can be present in deprotonated form in a preferred embodiment.

Halogens, such as fluorine, have a strong electron-attracting effect on account of their high electronegativity. This is of particular importance for the adaptation of the electronic properties of the complex. In particular, the electron-attracting groups allow an increase of the Lewis acidity of the zinc complex and thus an intensification of the effect of said complex as a p-dopant. In addition, electron-attracting groups such as halogens and haloalkyls have a stabilizing effect on the zinc complex according to the invention.

An alternative preferred embodiment relates to an organic electrical component according to the invention with a zinc complex, wherein the group $R^3$ of the ligand L is selected from the group containing:

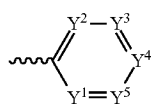

wherein $Y^1$—$Y^5$ are selected independently of one another from the group comprising C—H, C-D, C—F, C—$NO_2$, C—CN, C-halogen, C-pseudohalogen, N or C—$C_nF_{2n+1}$ with n=1 to 10, in particular C—$CF_3$ (i.e., n=1).

Such zinc complexes are particularly stable and are therefore particularly well suited for use as a p-dopant.

In accordance with a further embodiment, $R^3$ is selected from the group comprising:

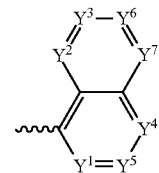

wherein $Y^1$—$Y^7$ are selected independently of one another from the group comprising C—H, C-D, C—F, C—$NO_2$, C—CN, C-halogen, C-pseudohalogen, N or C—$C_nF_{2n+1}$ with n=1 to 10, in particular C—$CF_3$ (i.e., n=1).

In accordance with a preferred embodiment, $R^3$ is selected from the group containing:

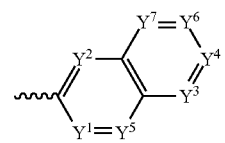

wherein $Y^1$—$Y^7$ are selected independently of one another from the group comprising C—H, C-D, C—F, C—$NO_2$, C—CN, C-halogen, C-pseudohalogen, N or C—$C_nF_{2n+1}$ with n=1 to 10, in particular C—$CF_3$ (i.e., n=1).

In accordance with a preferred embodiment $R^3$ is selected from the group containing:

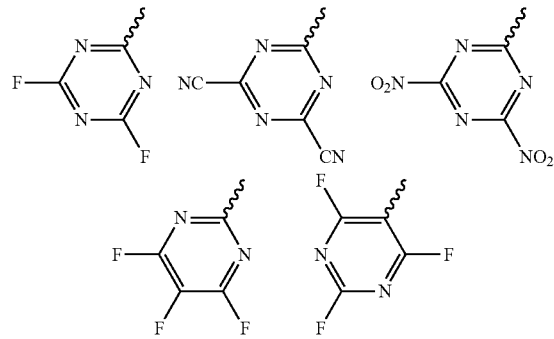

In accordance with another development of the invention $R^3$ is selected from the group containing halogenated, preferably perhalogenated and/or pseudohalogenated pteridines, iopteridines, naphthyridines, quinoxalines and azaquinoxalines.

In accordance with a further embodiment, the metal complex (without presence of matrix material) is Lewis acidic, i.e., it acts as an electron pair acceptor. This has proven to be particularly preferred for interaction with the matrix materials.

In accordance with another preferred development of the invention, the metal complex (without presence of matrix material) has at least one open or partially accessible coordination point. This has also proven to be particularly preferred for interaction with the matrix materials.

A particularly preferred embodiment of the invention relates to an organic electrical component according to the invention in which the two groups $R^1$ and $R^2$ of the ligand L of the zinc complex are each oxygen atoms. In this case the ligand L is a carboxylate ligand.

The inventors of the present invention have found that the zinc complex of the carboxylates are stable and at the same time particularly effective p-dopants. The carboxylate ligands are additionally easily obtainable and inexpensive, since the respective associated carboxylic acid is widespread and cost-effective.

In a further preferred embodiment the metal complex can contain at least one ligand L selected from the group of non-substituted, partially fluorinated or perfluorinated organic carboxylic acids. Organic carboxylic acids can generally be selected from the groups of aliphatic, saturated monocarboxylic acids; aliphatic, unsaturated monocarboxylic acids; aliphatic saturated dicarboxylic acids; aliphatic saturated tricarboxylic acids; aliphatic unsaturated dicarboxylic acids; aromatic carboxylic acids; heterocyclic carboxylic acids; and aliphatic, unsaturated cyclic monocarboxylic acids. Particularly preferred partial or perfluorinated ligands L are selected from substituted or unsubstituted compounds of acetic acid, phenylacetic acid and/or benzoic acid and are specified above by way of example. Non-fluorinated, partially fluorinated, or perfluorinated acetic acid is particularly preferred.

These ligands are particularly well-suited carboxylate ligands on account of their electron-attracting substituents, since they permit particularly high Lewis acidities of the zinc complex.

In a further embodiment of the invention the zinc complex is a heteroleptic complex. By use of more than just one ligand form, a greater diversity is made possible. In addition, the Lewis acidities of the zinc atom(s) of the complex can thus be better controlled, whereby particularly effective p-dopants can be attained.

One embodiment of the invention relates to a component according to the invention, wherein the zinc complex, in addition to the ligand L, also comprises at least one ligand different therefrom, which is bonded via a donor atom to a zinc central atom of the zinc complex. The donor atom can be oxygen, for example. The ligand is then an alkoxide.

A particularly preferred development of the invention relates to a component according to the invention, wherein the zinc complex, in addition to the ligand L, also comprises at least one further ligand $L^C$, which is bonded via a carbon atom to a zinc central atom. The zinc complex thus comprises at least one zinc-carbon bond. Zinc complexes of this form enable a particularly high diversity of the structure of zinc complexes which go even further beyond the structures of known p-dopants with the ligand L.

The least one further ligand $L^C$ can be, independently of one another, for example, a substituted or unsubstituted, branched or linear, and also a cyclic alkyl. It can also be a substituted or unsubstituted aryl or heteroaryl. By way of example, without the invention being limited hereto, methyl, ethyl, propyl, iso-propyl-, butyl, iso-butyl, tert-butyl, pentyl, hexyl, phenyl, benzyl, naphthyl, cyclohexyl, adamantyl, or other typical ligands of known organometallic complexes of zinc can act as ligand $L^C$.

The inventors have found that these complexes allow a unique diversity in the coordination geometry of the zinc in combination with the previously described ligand L. In particular, the inventors have established that these zinc complexes with both types of ligands, L and $L^C$, are unexpectedly excellent p-dopants, which can be used for the doping of matrix materials in organic electrical components.

In particular, the structural diversity of these zinc complexes is much greater than that of the metal complexes presented in the patent documents mentioned in the introduction. This allows new possibilities with regard to the adaptation of the zinc complexes in respect of the doping strength and temperature stability.

In a preferred embodiment $L^C$ can be a haloalkyl. Such complexes have a higher Lewis acidity. This is the case in particular when the halogen is fluorine.

In a particularly preferred embodiment the ligand $L^C$ can comprise at least one fluorine atom. In particular, the at least one ligand $L^C$ can be selected, independently of one another, from the group of fluorinated, branched order linear and also cyclic alkyls. Lc can also be a fluorinated aryl or heteroaryl. By way of example, without the invention being limited hereto, the substituents methyl, ethyl, propyl, iso-propyl, butyl, iso-butyl, tert-butyl, pentyl, hexyl, phenyl, benzyl, naphthyl, cyclohexyl, adamantyl, or other typical ligands of known organometallic complexes of zinc can then also act as ligand $L^C$ if they have been modified by fluorination, i.e., one or more hydrogen atoms have been replaced by fluorine atoms. By way of example, the analog perfluorinated substituents can also be used as ligand $L^C$.

The inventors of the present invention have established that the Lewis acidity of the zinc complex compared to non-fluorinated ligands $L^C$ can be increased further still by the use of fluorinated ligands $L^C$, which leads to a further improvement of the dopant effect. The higher is the number of fluorine atoms, the stronger is the effect.

A further embodiment of the invention relates to an organic electronic component according to the invention comprising a zinc complex, wherein zinc can have the coordination number 4, 5 or 6. By way of example, zinc is tetrahedrally and octahedrally coordinated multiple times.

The inventors have found that the various coordination possibilities of zinc are also useful for the production of a multiplicity of p-dopants based on zinc complexes.

In a particularly preferred embodiment of the invention zinc has the oxidation stage II. Zinc in the oxidation stage II has a particularly high Lewis acidity and is therefore particularly suitable as p-dopant.

In a further preferred embodiment the zinc complex is not a mononuclear complex, but a polynuclear metal complex. By way of example, the metal complex can comprise 2, 3, 4, 5, 6 or also more metal atoms.

In another embodiment the zinc complex is a trinuclear or pentanuclear metal complex. In contrast to other metal complexes with the ligand L, zinc is not limited to mononuclear, dinuclear, tetranuclear and hexanuclear complexes, but also permits the formation of polynuclear zinc complexes having an odd number of central atoms. By way of example, three or even five zinc atoms can be present in the complex. In the case of the presence of three zinc atoms, these can be present in a form bridged in a practically linear arrangement, for example, by the ligand L.

A structure of this type with a trinuclear zinc complex is shown by way of example in FIG. 6. FIG. 7 shows an example of a pentanuclear complex.

These structures are unique for zinc complexes. The inventors have found that the versatility of the zinc complex chemistry permits new flexibility when it comes to doping. In particular, a more targeted adaptation of the doping strength can be achieved due to the variety of the possible complex structures with various numbers of centers for the Lewis acidity.

In one embodiment of the invention at least one ligand L is bonded terminally to a zinc atom.

Here, it is possible in accordance with a preferred embodiment of the invention that at least one ligand L is coordinately bonded to the zinc only via one donor atom, i.e., only via one of the two groupings $R^1$ or $R^2$.

This can be schematically illustrated as follows:

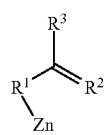

For the example that L is a carboxylate ligand, i.e., a ligand L in which both $R^1$ and $R^2$ are an oxygen atom, this means that just one of the two oxygen atoms is bonded to the zinc atom.

In another embodiment the zinc complex comprises at least one ligand L, which is coordinately bonded to the same zinc atom by means of both donor atoms. This can be schematically illustrated as follows:

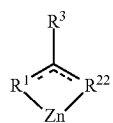

For the example that L is a carboxylate ligand, i.e., a ligand L in which both $R^1$ and $R^2$ are an oxygen atom, this means that both oxygen atoms are bonded to the zinc atom.

Another development of the invention relates to an organic electrical component according to the invention, wherein the zinc complex is a polynuclear metal complex, and wherein at the same time at least one of the ligands L coordinately bonds two metal atoms.

Without being bound to this theory, it is possible in the case of polynuclear complexes to provide a bridging between the at least two metal atoms with the ligand L of the zinc complex. Here, there can be a bidentate or tridentate coordinate bonding of the metal atom.

This can be schematically illustrated as follows:

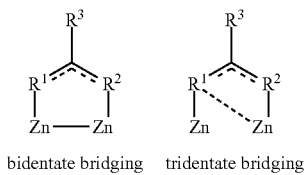

bidentate bridging    tridentate bridging

In another development of the invention the zinc complex is a polynuclear metal complex, comprising at least two ligands L, wherein at least one of the ligands L coordinately bonds two metal atoms, whereas at least one further ligand L is bonded terminally to a metal center of the zinc complex.

In another development of the invention the zinc complex comprises at least two zinc atoms. The complex can have precisely two zinc atoms, for example, but can also have three, four, five, or six zinc atoms or also more zinc atoms.

The inventors have found that more than just one zinc atom afford the advantage that corresponding complexes provide a plurality of zinc atoms as Lewis acid centers and thus are particularly effective as p-dopant.

Another embodiment of the invention relates to an organic electrical component according to the invention, wherein the zinc complex, in addition to zinc, also comprises at least one further metal different from zinc.

If different metal atoms are also used to construct a polynuclear complex, a hetero-bimetallic complex results.

Here as well, the ligand L can act in a bridging manner, which can be schematically illustrated as follows:

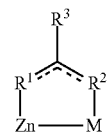

Here, M is a metal atom different from zinc and forms a further central atom of the zinc complex.

A further embodiment of the invention relates to a component according to invention, as just described, wherein the metal different from zinc is selected from the group containing Mn, Mg, Ca, Sr, Ba and Cu. The inventors of the present invention have found that complexes comprising both zinc and metals of the aforementioned group form stable p-dopants which have a sufficiently high Lewis acidity in order to act as effective dopants and to attain good conductivities.

In accordance with another preferred embodiment, the compounds can be processed both in the gas phase and the liquid phase. In the case of gas phase deposition, both dopant and matrix material are evaporated jointly, preferably from different sources, in a high vacuum and are deposited in the form of a layer. In the case of processing from the liquid phase, the metal complex and the matrix material are dissolved in a solvent and are deposited by means of printing techniques, spin coating, application by doctor blade, slot coating, etc. The finished layer is obtained by evaporation of the solvent. Here, any doping ratios can be set as desired due to the different mass ratios of metal complex to the matrix material.

The following hole conductors can be processed particularly preferably by means of a solvent process:

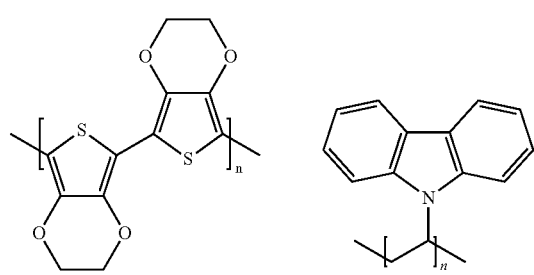

PDOT = poly(3,4ethylenedioxythiophene)    PVK = poly(9-vinylcarbazole)

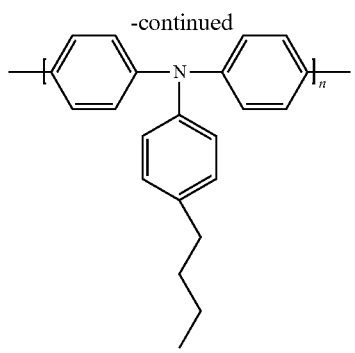

PTPD = poly(N,N'-bis(4-butylphenyl)-N,N'-bis(phenyl)benzidine

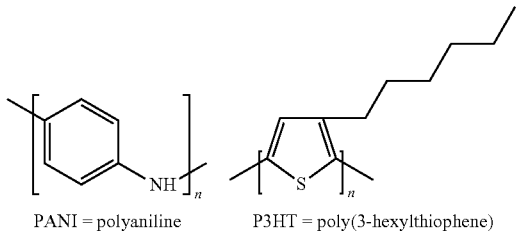

PANI = polyaniline    P3HT = poly(3-hexylthiophene)

Furthermore, matrix materials which are designated as "small molecules" can be processed particularly preferably by means of a solvent process. This substance class is known to a person skilled in the art and, for example, includes spiro-TAD (2,2',7,7'-tetrakis-(N,N-diphenylamino)-9,9'-spirobifluorene) and spiro-TTB (2,2',7,7'-tetrakis-(N,N'-di-p-methylphenylamino)-9,9'-spirobifluorene and further materials as are specified in this application as matrix materials.

In accordance with another preferred embodiment, the matrix material of the organic electronic component according to the invention comprises one or more of the following materials, which, for example, can be found in hole transport layers:

NPB (N,N'-bis(naphthalen-1-yl)-N,N'-bis(phenyl)-benzidine), β-NPB N,N'-bis(naphthalen-2-yl)-N,N'-bis(phenyl)-benzidine), TPD (N,N'-bis(3-methylphenyl)-N,N'-bis(phenyl)-benzidine), spiro-TPD (N,N'-bis(3-methylphenyl)-N,N'-bis(phenyl)-benzidine), spiro-NPB (N,N'-bis(naphthalen-1-yl)-N,N'-bis(phenyl)-spiro), DMFL-TPD N,N'-bis(3-methylpheny1)-N,N'-bis (pheny1)-9,9-dimethyl-fluorene), α-NPD N,N'-bis(naphthalen-1-yl)-N,N'-bis(phenyl)-2,2-dimethylbenzidine, N,N'-bis(3-methylphenyl)-N,N'-bis(phenyl)-9,9-spiro-fluorene, N,N'-bis(naphthalen-1-yl)-N,N'-bis(phenyl)-9,9-spirofluorene, N,N'-bis(3-methylphenyl)-N,N'-bis(phenyl)-2,7-diamino-9,9-spirofluorene, N,N'-bis(naphthalen-1-yl)-N,N'-bis(phenyl)-2,7-diamino-9,9-spirofluorene, DMFL-NPB (N,N'-bis(naphthalen-1-yl)-N,N'-bis(phenyl)-9,9-dimethyl-fluorene), DPFL-TPD (N,N'-bis(3-methylphenyl)-N,N'-bis(phenyl)-9,9-diphenyl-fluorene), DPFL-NPB (N,N'-bis(naphthalen-1-yl)-N,N'-bis(phenyl)-9,9-diphenyl-fluorene), spiro-TAD (2,2',7,7'-tetrakis(N,N-diphenylamino)-9,9'-spirobifluorene), 9,9-bis[4-(N,N-bis-biphenyl-4-yl-amino)phenyl]-9H-fluoren, NPAPF 9,9-bis[4-(N,N-bis-naphthalen-2-yl-amino) phenyl]-9H-fluorene, NPBAPF 9,9-bis[4-(N-naphthalen-1-yl-N-phenylamino)-phenyl]-9H-fluorene, 9,9-bis[4-(N,N'-bis-naphthalen-2-yl-N,N'-bis-phenyl-amino)-phenyl]-9H-fluorene, PAPB N,N'-bis(phenanthren-9-yl)-N,N'-bis(phenyl)-benzidine, 2,7-bis[N,N-bis(9,9-spiro-bifluorene-2-yl-amino)-9, 9-spiro-bifluorene, 2,2'-bis[N,N-bis(biphenyl-4-yl)amino]9,9-spiro-bifluorene, 2,2'-bis(N,N-di-phenyl-amino)9,9-spiro-bifluoren, Di-[4-(N,N-ditolyl-amino)-phenyl]cyclohexane, 2,2',7,7'-tetra(N,N-di-tolyl)amino-spiro-bifluorene, N,N, N',N'-tetra-naphthalen-2-yl-benzidine, spiro-2NPB 2,2',7,7'-tetrakis[N-naphthalenyl(phenyeamino]-9,9-spirobifluorene, spiro-TTB (2,2',7,7'-tetrakis-(N,N'-di-p-methylphenylamino)-9,9'-spirobifluorene), TiOPC titanium oxide phthalocyanine, CuPC copper phthalocyanine, F4-TCNQ 2,3,5,6-tetrafluoro-7,7,8,8-tetracyano-quinodimethane, 4,4',4''-Tris(N-3-methylphenyl-N-phenyl-amino)triphenylamine, 4,4',4''-tris(N-(2-naphthyl)-N-phenyl-amino)triphenylamine, 4,4',4''-tris(N-(1-naphthyl)-N-phenyl-amino)triphenylamine, 4,4',4''-tris(N,N-diphenyl-amino)triphenylamine, PPDN pyrazino[2,3-f][1,10]phenanthroline-2,3-dicarbonitrile, MeO-TPD N,N,N',N'-tetrakis(4-methoxyphenyl) benzidine, spiro-MeOTAD $N^2,N^2,N^{2'},N^{2'},N^7,N^7,N^{7'}, N^{7'}$-octakis(4-methoxyphenyl)-9,9'-spirobi[9H-fluorene]-2,2',7,7'-tetramine.

The possible matrix materials, however, are not limited to the specified materials. Other materials, such as the commercially obtainable matrix materials from the companies Merck, Novaled and Hodogaya with the product names HTM014, HTM081, HTM163, HTM222, NHT5, NHT49, NHT51, EL-301, EL-22T are particularly well suited. However, comparable commercially obtainable materials can also be used.

These materials have proven their worth as matrix materials in organic electronic components.

In accordance with a preferred embodiment of the invention, the degree of doping in mol of the metal complex in relation to mol of the matrix material is from ≥0.1% to ≤50%. This has proven to be expedient. The degree of doping is preferably from ≥0.5% to ≤15%, even more preferably from ≥1 to ≤5%.

The zinc complexes of the organic electrical component according to the invention can additionally also be used in electron blocking layers in another embodiment of the invention if they are co-evaporated with an at least partially electron conducting material.

Here, typical electron conducting materials are:

2,2',2''-(1,3,5-benzinetriyetris(1-phenyl-1-H-benzimidazole)

2-(4-biphenylyl)-5-(4-tert-butylphenyl)-1,3,4-oxadiazole 2,9-dimethyl-4,7-diphenyl-1,10-phenanthroline 8-hydroxyquinolinolato-lithium 4-(naphthalen-1-yl)-3,5-diphenyl-4H-1,2,4-triazole 1,3-bis[2-(2,2'-bipyridin-6-yl)-1,3,4-oxadiazo-5-yl]benzene 4,7-diphenyl-1,10-phenanthroline 3-(4-biphenylyl)-4-phenyl-5-tert-butylphenyl-1,2,4-triazole bis(2-methyl-8-quinolinolate)-4-(phenylphenolato)aluminum 6,6'-bis[5-(biphenyl-4-yl)-1,3,4-oxadiazo-2-yl]-2,2'bipyridyl 2-phenyl-9,10-di(naphthalen-2-yl-anthracene 2,7-bis[2-(2,2'-bipyridine-6-yl)-1,3,4-oxadiazo-5-yl]-9,9-dimethylfluorene 1,3-bis[2-(4-tert-butylphenyl)-1,3,4-oxadiazo-5-yl]benzene 2-(naphthalen-2-yl)-4,7-diphenyl-1,10-phenanthroline 2,9-bis(naphthalen-2-yl)-4,7-diphenyl-1,10-phenanthroline tris(2,4,6-trimethyl-3-(pyridin-3-yl)phenyl)borane 1-methyl-2-(4-(naphthalen-2-yl)phenyl)-1H-imidazo[4,5-f][1,10]phenanthroline.

A blocking and limitation of the electron flow is of great importance, for example, for highly efficient organic light-emitting diodes (OLEDs).

In accordance with further embodiments, organic electronic components according to the present invention can have a series of further layers, as are used conventionally in organic electronic components. Some possibilities for this will be specified hereinafter, without being considered as limiting.

In accordance with one embodiment, the component according to the invention can have, for example, a hole blocking layer (HBL for short). The material for the hole blocking layer can be selected from the group comprising 2,2',2"-(1,3,5-benzinetriye-tris(1-phenyl-1-H-benzimidazole), 2-(4-biphenylyl)-5-(4-tert-butylphenyl)-1,3,4-oxadiazole, 2,9-dimethyl-4,7-diphenyl-1,10-phenanthroline (BCP), 8-hydroxyquinolinolato-lithium, 4-(naphthalen-1-yl)-3,5-diphenyl-4H-1,2,4-triazole, 1,3-bis [2-(2,2'-bipyridine-6-yl)-1,3,4-oxadiazo-5-yl]benzene, 4,7-diphenyl-1,10-phenanthroline (BPhen)1

3-(4-biphenylyl)-4-phenyl-5-tert-butylphenyl-1,2,4-triazole, bis(2-methyl-8-quinolinolate)-4-(phenylphenolato)aluminum, 6,6'-bis[5-(biphenyl-4-yl)-1,3,4-oxadiazo-2-yl]-2,2'-bipyridyl, 2-phenyl-9,10-di(naphthalen-2-yl)-anthracene, 2,7-bis[2-(2,2'-bipyridine-6-yl)-1,3,4-oxadiazo-5-yl]-9,9-dimethylfluorene, 1,3-bis[2-(4-tert-butylphenyl)-1,3,4-oxadiazo-5-yl]benzene, 2-(naphthalen-2-yl)-4,7-diphenyl-1,10-phenanthroline, 2,9-bis(naphthalen-2-yl)-4,7-diphenyl-1,10-phenanthroline, tris(2,4,6-trimethyl-3-(pyridin-3-yl)phenyl)borane, 1-methyl-2-(4-(naphthalen-2-yl)phenyl)-1H-imidazo[4,5-f][1,10]phenanthroline, phenyl-dipyrenylphosphine oxide, naphthalene tetracarboxylic acid dianhydride and imides thereof, perylene tetracarboxylic acid dianhydride and imides thereof, materials based on silols with a silacyclopentadiene unit, and mixtures thereof.

In accordance with a further embodiment, organic electronic components according to the invention can have an electron injection layer. The material for an electron injection layer can be selected from a group which comprises NET-18, NET-218 (each product names of the company Novaled), ET093 (product name of the company Idemitsu Kosan), ETM020, ETM033, ETM034, ETM036 (each product names of the company Merck) and comparable commercial materials, as well as 2,2',2"-(1,3,5-benzinetriye-tris (1-phenyl-1-H-benzimidazole), 2-(4-biphenylyl)-5-(4-tert-butylphenyl)-1,3,4-oxadiazole, 2,9-dimethyl-4,7-diphenyl-1,10-phenanthroline (BCP), 8-hydroxyquinolinolato-lithium, 4-(naphthalen-1-yl)-3,5-diphenyl-4H-1,2,4-triazole, 1,3-bis[2-(2,2'-bipyridine-6-yl)-1,3,4-oxadiazo-5-yl]benzene, 4,7-diphenyl-1,10-phenanthroline (BPhen), 3-(4-biphenylyl)-4-phenyl-5-tert-butylphenyl-1,2,4-triazole, bis(2-methyl-8-quinolinolate)-4-(phenylphenolato)aluminum, 6,6'-bis[5-(biphenyl-4-yl)-1,3,4-oxadiazo-2-yl]-2,2'-bipyridyl, 2-phenyl-9,10-di(naphthalen-2-yl)-anthracene, 2,7-bis[2-(2,2'-bipyridine-6-yl)-1,3,4-oxadiazo-5-yl]-9,9-dimethylfluorene, 1,3-bis[2-(4-tert-butylphenyl)-1,3,4-oxadiazo-5-yl]benzene, 2-(naphthalen-2-yl)-4,7-diphenyl-1,10-phenanthroline, 2,9-bis(naphthalen-2-yl)-4,7-diphenyl-1,10-phenanthroline, tris(2,4,6-trimethyl-3-(pyridin-3-yl)phenyl)borane, 1-methyl-2-(4-(naphthalen-2-yl)phenyl)-1H-imidazo[4,5-f][1,10]phenanthroline, phenyl-dipyrenylphosphine oxides, naphthalene tetracarboxylic acid dianhydride and imides thereof, perylene tetracarboxylic acid dianhydride and imides thereof, materials based on silos with a silacyclopentadiene unit and mixtures of the aforementioned substances.

The electron injection layer can also comprise an n-dopant. One or more materials selected from a group comprising NDN-1, NDN-26 (each product names of the company Novaled), Na, Ca, Mg, Ag, Cs, Li, Mg, Yb, $Cs_2CO_3$ and $Cs_3PO_4$ or mixtures thereof can be considered as n-dopant.

In accordance with a further embodiment, organic electronic components according to the invention can comprise an emitting layer. The emitting layer can comprise organic materials which are fluorescent and/or phosphorescent materials. By way of example, organic or organometallic compounds, such as derivatives of polyfluorene, polythiophene and polyphenylene, for example, 2- or 2,5-substituted poly-p-phenylenevinylene) and/or metal complexes, for example, iridium complexes, such as blue-phosphorescent FIrPic (bis (3,5-difluoro-2-(2-pyridyl)phenyl-(2-carboxypyridyeiridium III), green-phosphorescent $Ir(ppy)_3$(tris(2-phenylpyridine)iridium III) and/or red-phosphorescent Ru$(dtb-bpy)_3*2(PF_6)$ (tris[4,4'-di-tert-butyl-(2,2')-bipyridine]ruthenium(III) complex), and also blue-phosphorescent DPAVBi (4,4-bis[4-(di-p-tolylamino)styryl]biphenyl), green-fluorescent TTPA (9,10-bis[N,N-di-(p-tolyl)-amino] anthracene) and/or red-fluorescent DCM2 (4-dicyanomethylene)-2-methyl-6-julolidyl-9-enyl-4H-pyran) are used as non-polymeric emitters.

In accordance with at least one embodiment, the organic electronic component comprises a substrate. In particular, one of the electrodes is arranged on the substrate. The substrate can comprise, for example, one or more materials in the form of a layer, a plate, a film, or a laminate, said material or materials being selected from glass, quartz, plastic, metal, silicon, and wafer. In particular, the substrate comprises or consists of glass.

The invention additionally relates to the use of a zinc complex as p-dopant for matrix materials of electronic components.

Here, the zinc complex comprises at least one ligand L of the following structure:

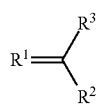

wherein $R^1$ and $R^2$ independently of one another can be oxygen, sulfur, selenium, NH or $NR^4$, wherein $R^4$ is selected from the group comprising alkyl or aryl and can be bonded to $R^3$; and $R^3$ is selected from the group comprising alkyl, long-chain alkyl, cycloalkyl, haloalkyl, aryl, arylene, haloaryl, heteroaryl, heteroarylene, heterocycloalkylene, heterocycloalkyl, haloheteroaryl, alkenyl, haloalkenyl, alkinyl, haloalkinyl, ketoaryl, haloketoaryl, ketoheteroaryl, ketoalkyl, haloketoalkyl, ketoalkenyl, haloketoalkenyl, haloalkylaryl, haloalkylheteroaryl, wherein, for suitable groups, one or more non-adjacent $CH_2$ groups can be replaced by —O—, —S—, —NH—, $—NR^{ooo}—$, $—SiR^o\text{-}R^{oo}$—, —CO—, —COO—, $—COR^oOR^{oo}$—, —OCO—, —OCO—O—, $—SO_2$—, —S—CO—, —CO—S—, —O—CS—, —CS—O—, —CY1=CY2 or —C≡C-independently from one another, and in such a way that O and/or S atoms are not directly bonded to one another, and are replaced optionally with aryl or heteroaryl preferably containing 1 to 30 C atoms (terminal $CH_3$ groups are understood to be $CH_2$ groups in the sense of $CH_2$—H).

The aforementioned and claimed components described in the exemplary embodiments and used in accordance with the invention are not subject in terms of their size, shaping, material selection or technical conception to any particular exceptions, and therefore the selection criteria known in the field of application can be applied without limitation.

BRIEF DESCRIPTION OF THE DRAWINGS

Further details, features and advantages of the subject matter of the invention will become clear from the dependent claims and also from the following description of the drawings and the associated general production methods and specific examples.

In the drawings:

FIGS. 12A and 12B illustrate the broad usability and good p-dopant effect of zinc complexes according to for various matrix materials;

FIG. 13B shows experimental data obtained by the organic light-emitting diodes of FIG. 13A.

DETAILED DESCRIPTION OF ILLUSTRATIVE EMBODIMENTS

Figure 1:
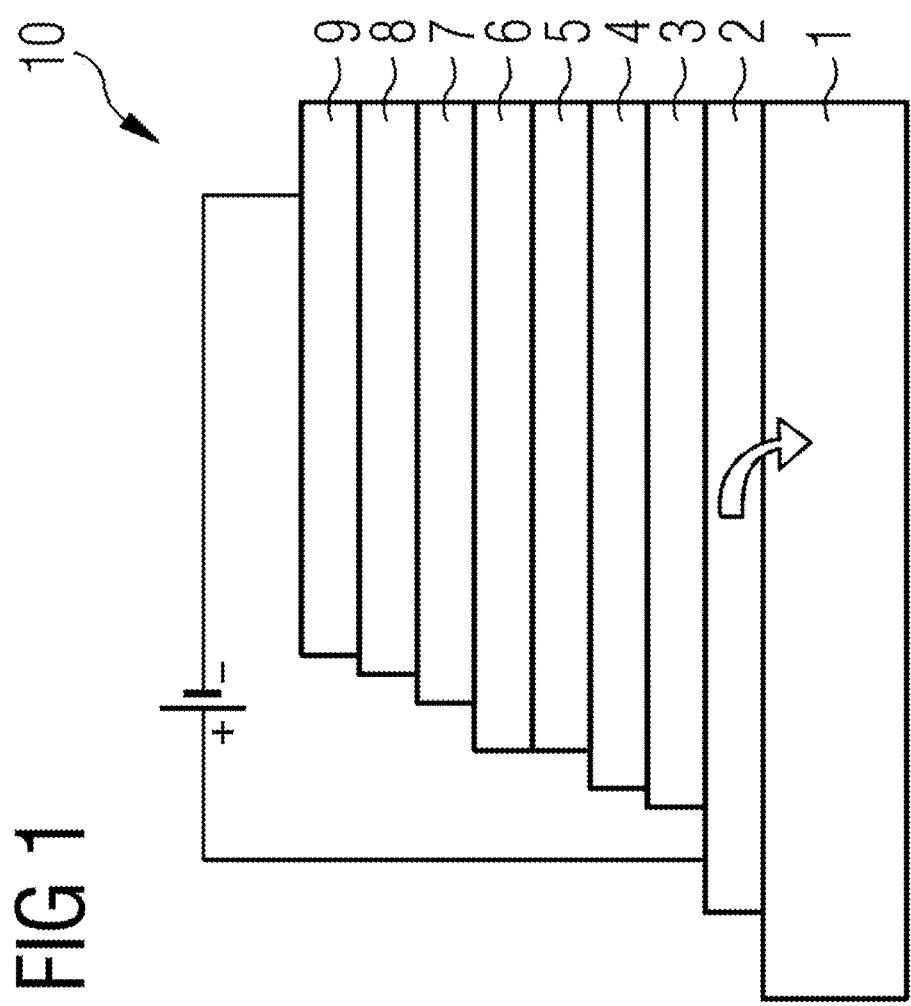
FIG. 1 shows the structure of an organic light-emitting diode.
Figure 2:
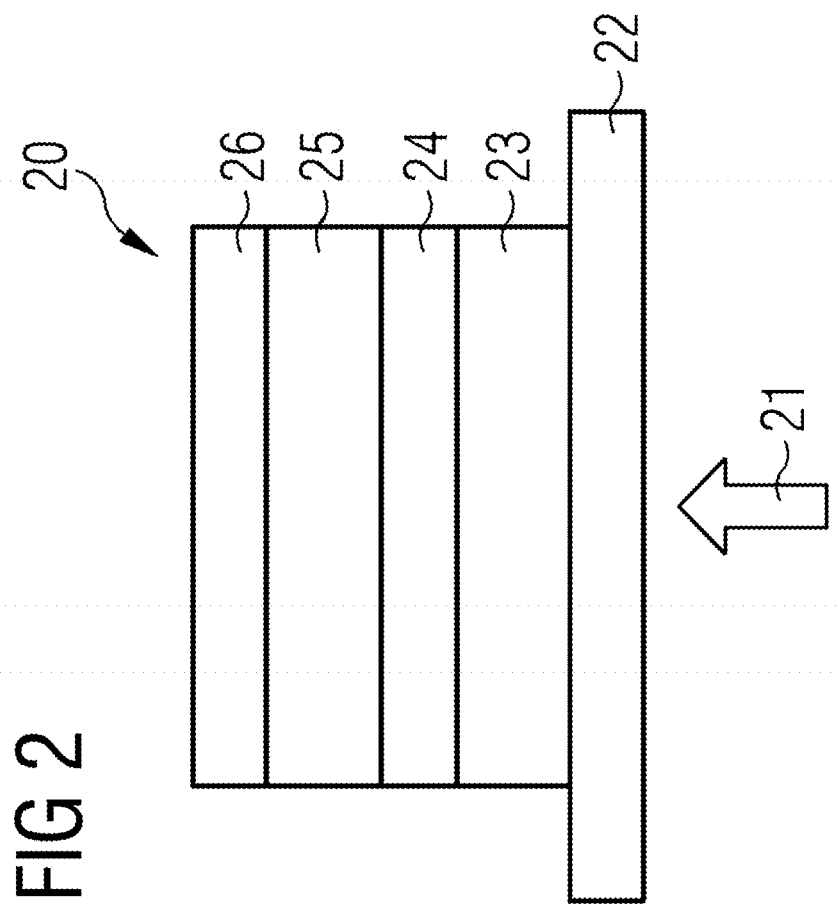
FIG. 2 shows the structure of an organic solar cell with PIN structure, which converts light into electrical power.
Figure 3:
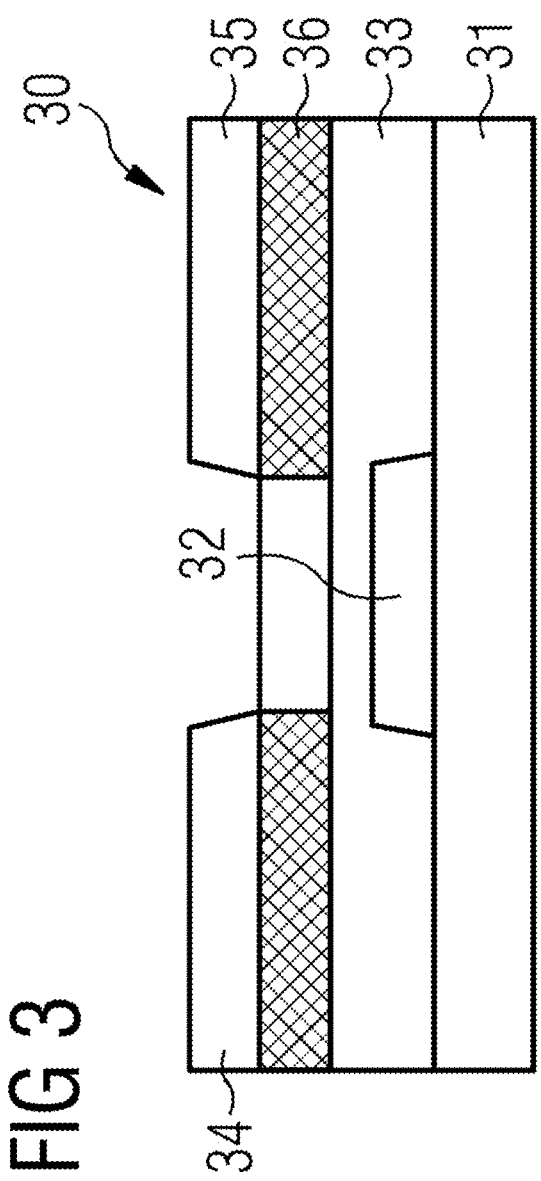
FIG. 3 shows a possible cross-section of an organic field-effect transistor.

FIG. 1 schematically shows the structure of an organic light-emitting diode (10). The light-emitting diode comprises or consists of the following layers: glass layer (1); transparent conductive oxide (TCO) or PEDOT:PPS or PANI layer (2); hole injection layer (3); hole transport layer (HTL) (4); emitting layer (EML) (5); hole blocking layer (HBL) (6); electron transport layer (ETL) (7); electron injection layer (8) and a cathode layer (9);

FIG. 2 schematically shows the structure of an organic solar cell with PIN structure (20), which converts light (21) into electrical power. The solar cell comprises or consists of a layer of indium tin oxide (22); a p-doped layer (23); an absorption layer (24); an n-doped layer (25) and a metal layer (26);

FIG. 3 schematically shows a possible cross-section of an organic field-effect transistor (30). There are applied to a substrate (31): a gate electrode (32), a gate dielectric (33), a source and drain contact (34+35) and an organic semiconductor (36). The hatched areas show the areas at which contact doping is helpful.

Figure 4:
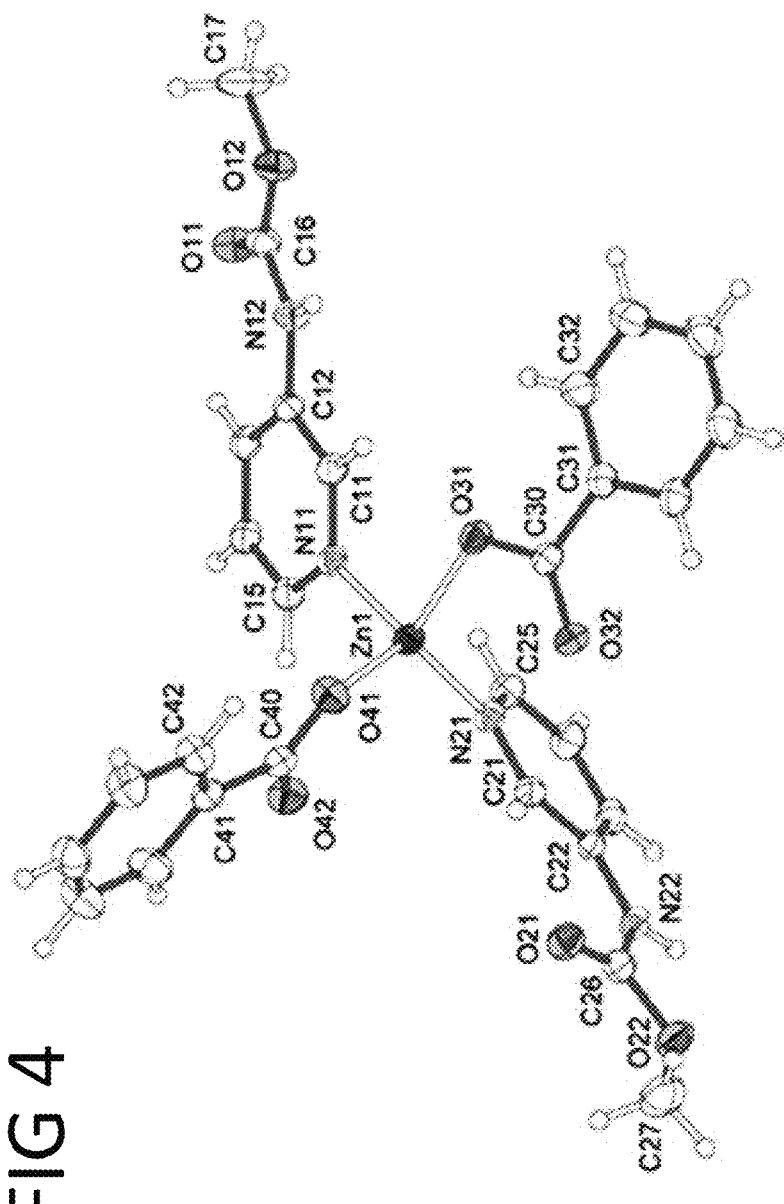
FIG. 4 shows a mononuclear zinc complex.

FIG. 4 schematically shows a mononuclear zinc complex, described by Zelenak et al. in "Preparation, characterisation and crystal structure of two zinc(II)benzoate complexes with pyridine-based ligands nicotinamide and methyl-3-pyridyl-carbamate" Inorganica Chimica Acta 357 (2004) 2049-2059.

Figure 5:
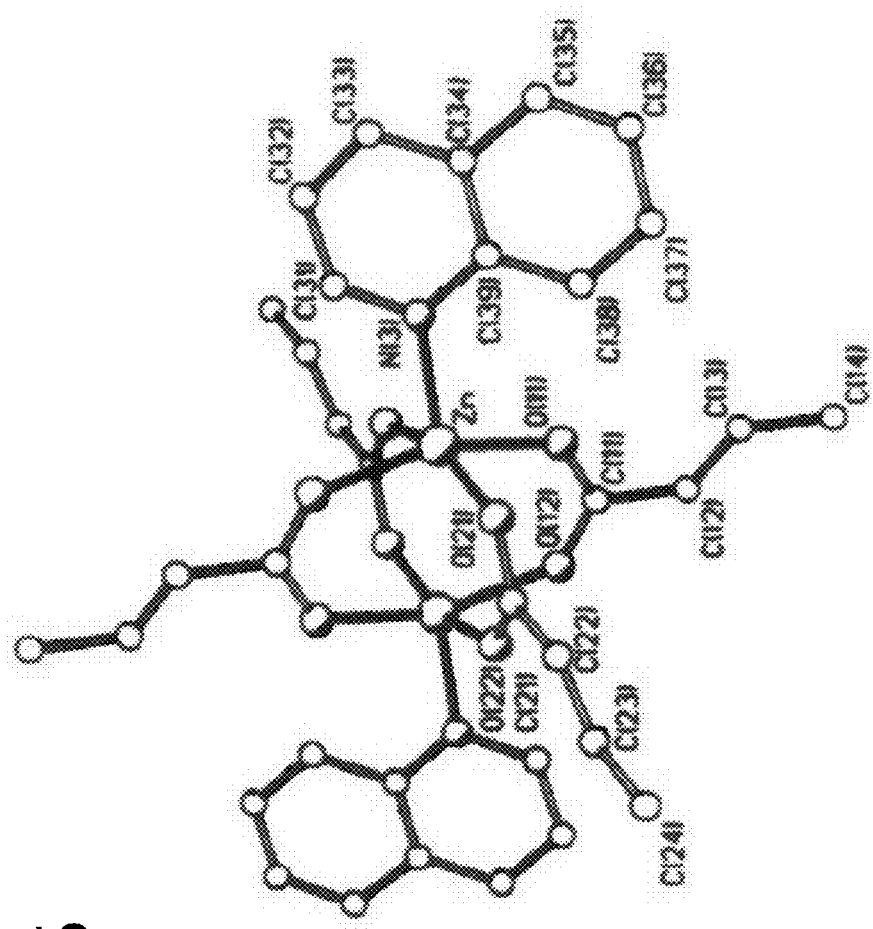
FIG. 5 shows a binuclear zinc complex with paddle wheel structure.

FIG. 5 schematically shows a binuclear zinc complex with paddle wheel structure, described by William Clegg et al. in "Zinc Carboxylate Complexes: Structural Characterisation of some Binuclear and Linear Trinuclear Complexes", J. Chem. Soc. Dalton Trans. 1986, 1283. In addition to quinoline, the carboxylate of crotonic acid acts as ligand in particular.

Figure 6:
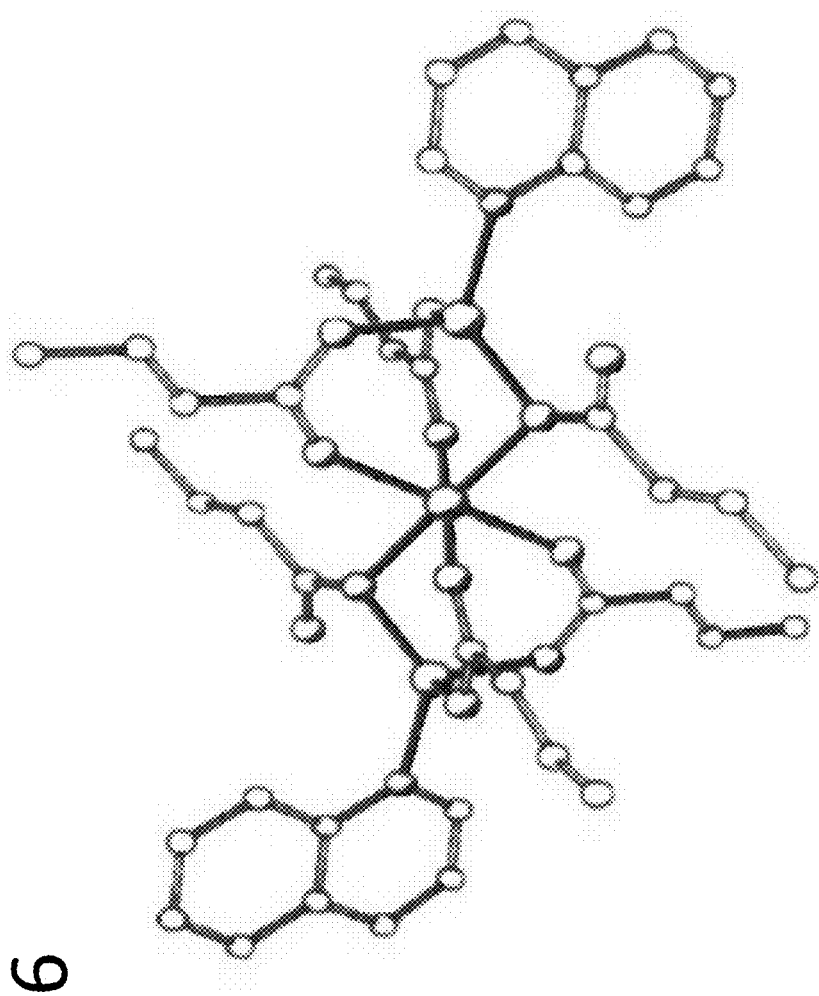
FIG. 6 shows a trinuclear zinc complex.

FIG. 6 schematically shows a trinuclear zinc complex also described by William Clegg et al. in "Zinc Carboxylate Complexes: Structural Characterisation of some Binuclear and Linear Trinuclear Complexes", J. Chem. Soc. Dalton Trans. 1986, 1283.

Figure 7:
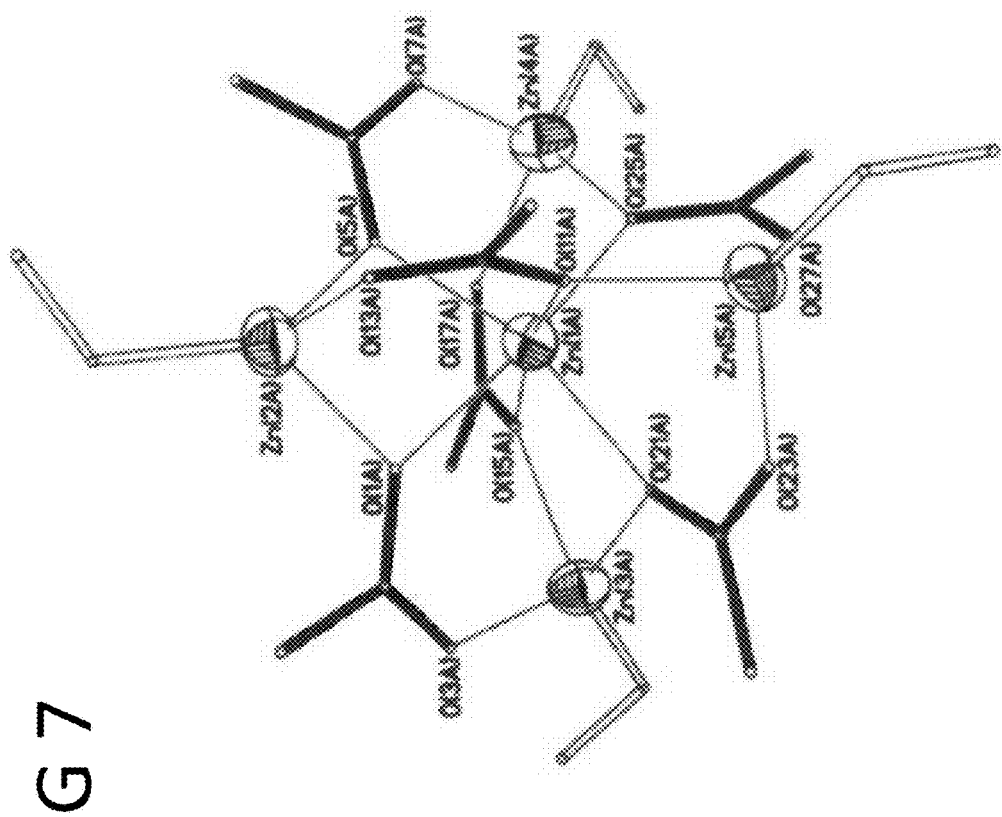
FIG. 7 shows a pentanuclear zinc complex comprising ethyl units.

FIG. 7 schematically shows a pentanuclear zinc complex comprising ethyl units, described by Katherine L. Orchard et al. in "Pentanuclear Complexes for a Series of Alkylzinc Carboxylates", Organometallics 2009, 28, 5828-5832. The high structural diversity is clear from the fact that the complex comprises alkyl ligands in addition to carboxylate ligands, said alkyl ligands not having been replaced completely by carboxylate ligands within the scope of the synthesis.

Figure 8:
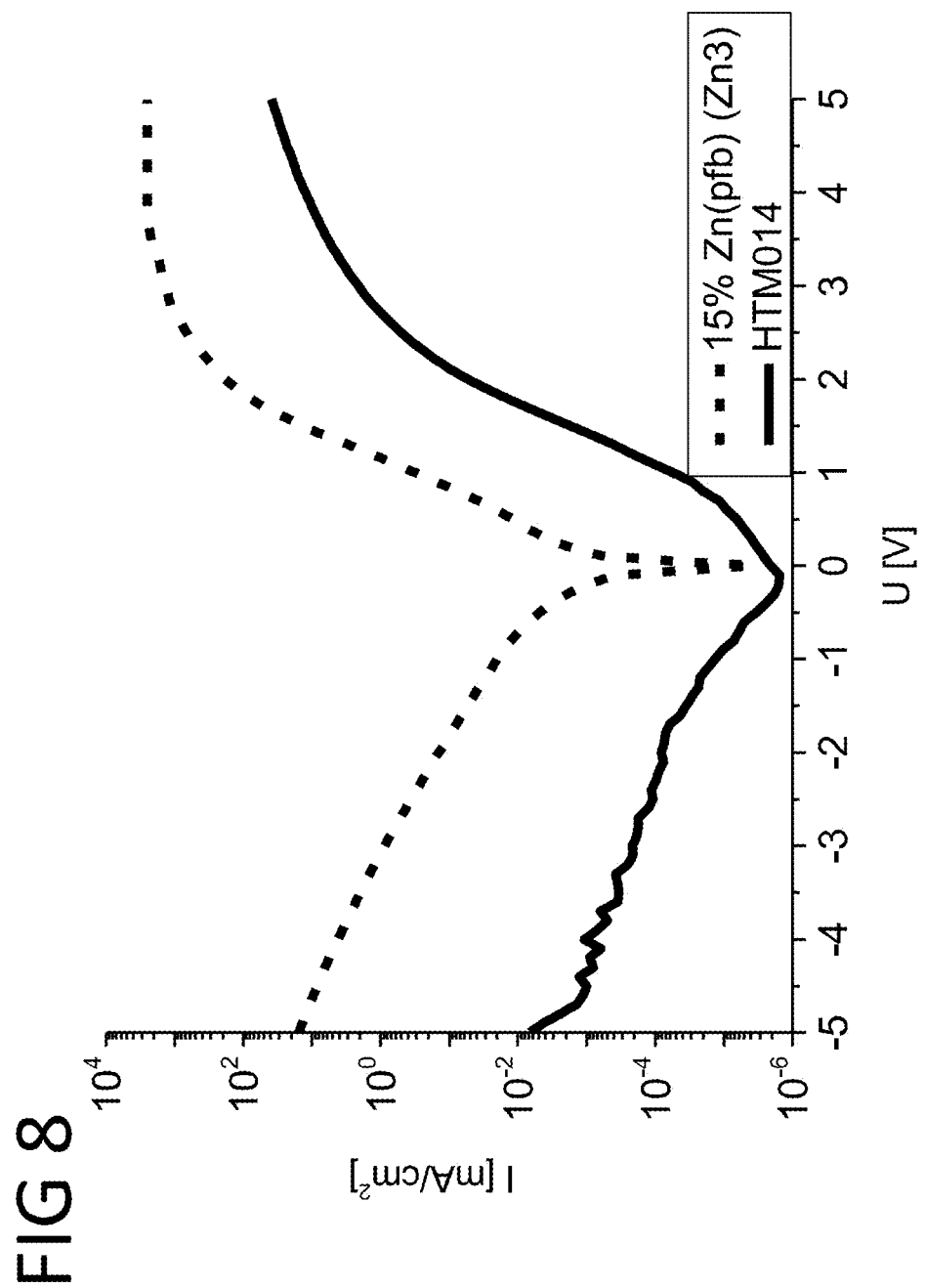
FIG. 8 shows the current density against the voltage for the undoped matrix material (HTM014) and for the matrix material doped with Zn3.

FIG. 8, for Example I, Zn3, schematically shows the current density against the voltage for the undoped matrix material (HTM014, Merck KGaA) and for the matrix material doped with Zn3. The co-evaporation of the zinc complex and of the matrix material is performed here in a temperature range of 169-182° C. The proportion of HTM014 in the obtained layer is 85 volume %. A very good dopant effect of the dopant is observed.

Figure 9:
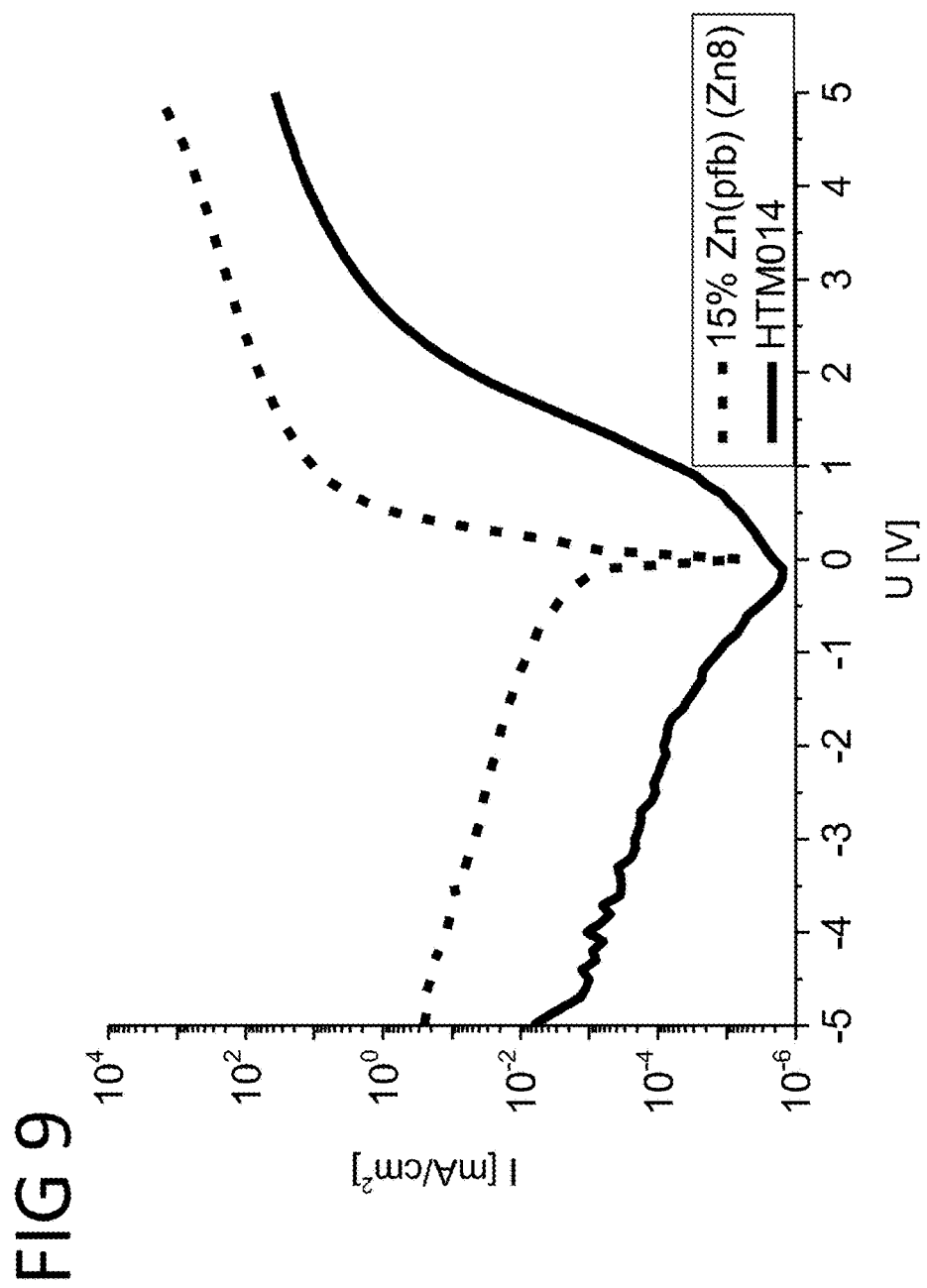
FIG. 9 shows the current density against the voltage for the undoped matrix material (HTM014) and for the matrix material doped with Zn8.

FIG. 9, for Example II, Zn8, schematically shows the current density against the voltage for the undoped matrix material (HTM014) and for the matrix material doped with Zn8. The co-evaporation of the zinc complex and of the matrix material is performed here in a temperature range of 230-231° C. The proportion of HTM014 in the obtained layer is 85 volume %. The good dopant properties are clearly evident from the graph. No outgassing is observed.

In Example II a much higher sublimation temperature is observed than in Example I. Thus, the compounds are not the same.

Figure 10:
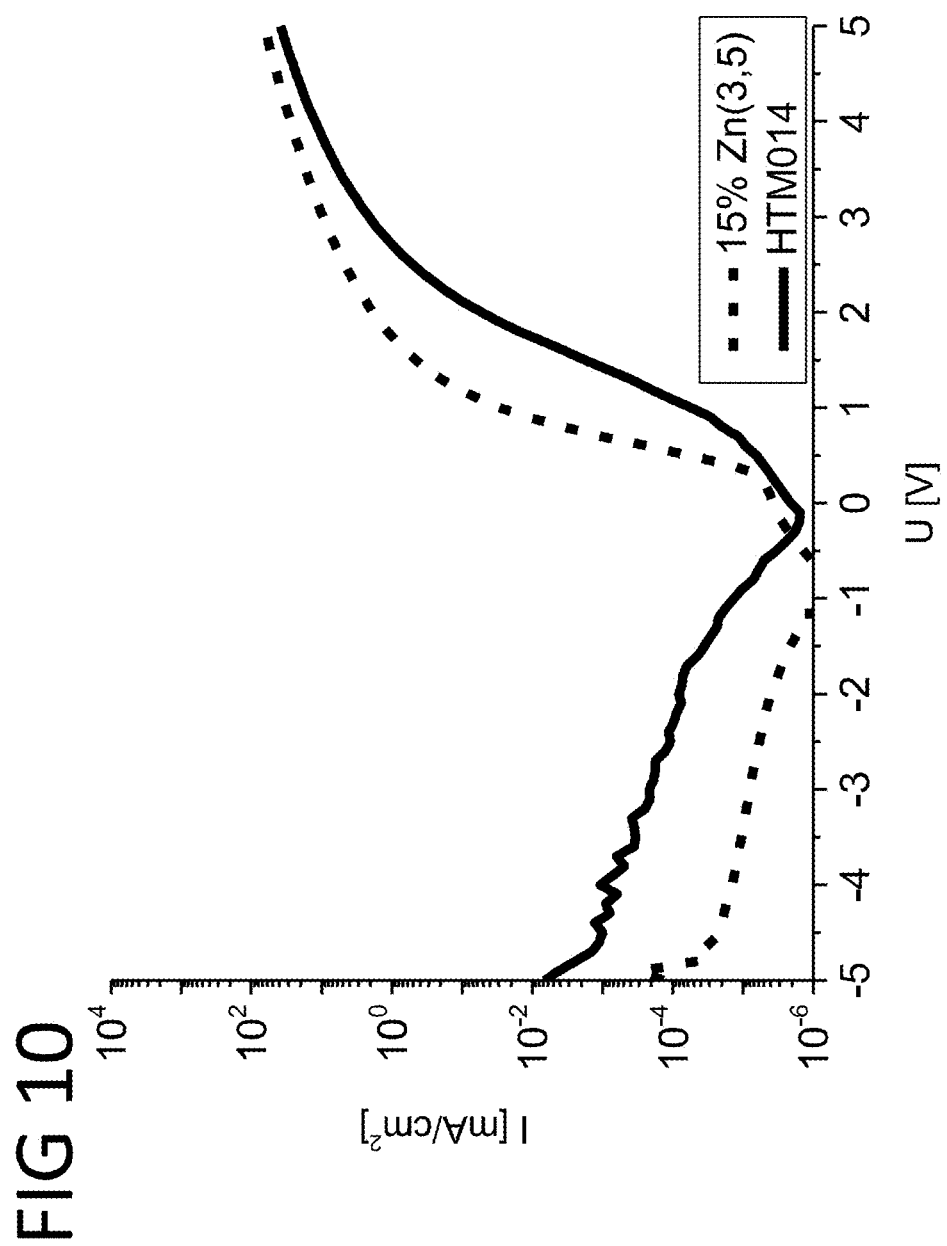
FIG. 10 shows the current density against the voltage for the undoped matrix material (HTM014) and for the matrix material doped with Zn(3,5-tfmb)

FIG. 10, for Example III, Zn(3,5), schematically shows the current density against the voltage for the undoped matrix material (HTM014) and for the matrix material doped with Zn(3,5-tfmb). The co-evaporation of the zinc complex and of the matrix material in the latter case is performed in a temperature range of 258-275° C. The proportion of HTM014 in the doped layer is 85 volume %. No doping effect is observed.

Figure 11:
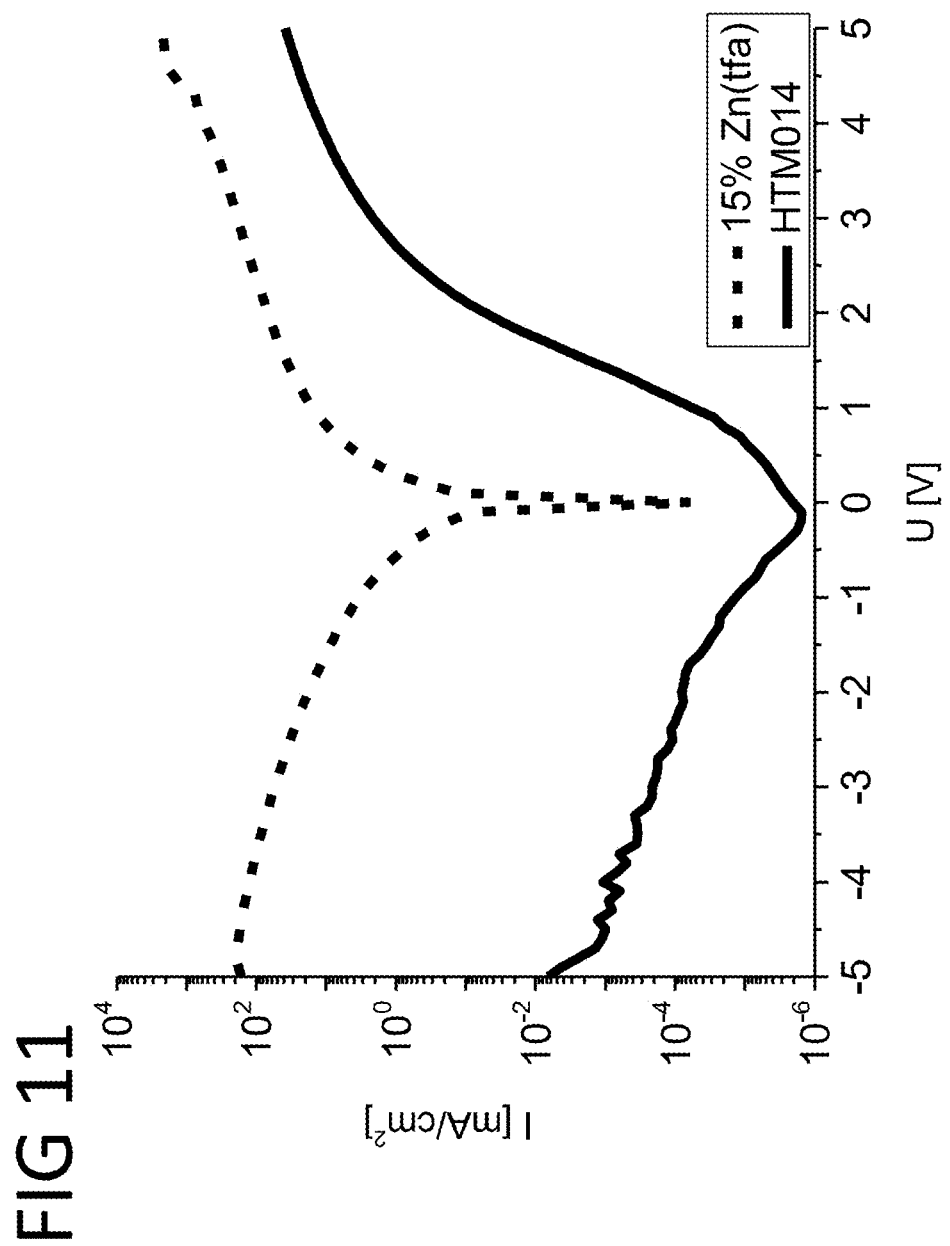
FIG. 11 shows the current density against the voltage for the undoped matrix material (HTM014) and for the matrix material doped with Zn(tfa)

FIG. 11, for Example IV, Zn(tfa), schematically shows the current density against the voltage for the undoped matrix material (HTM014) and for the matrix material doped with Zn(tfa). The proportion of HTM014 in the doped layer is 85 volume %. A very good doping effect is observed.

FIG. 12A, for Example IV, Zn(tfa), schematically shows the current density against the voltage. Here, the commercially obtainable matrix material NHT49 from Novaled is doped with Zn(tfa). The current-voltage curve shows an excellent p-dopant effect of the zinc complexes according to the invention.

Figure 12B:
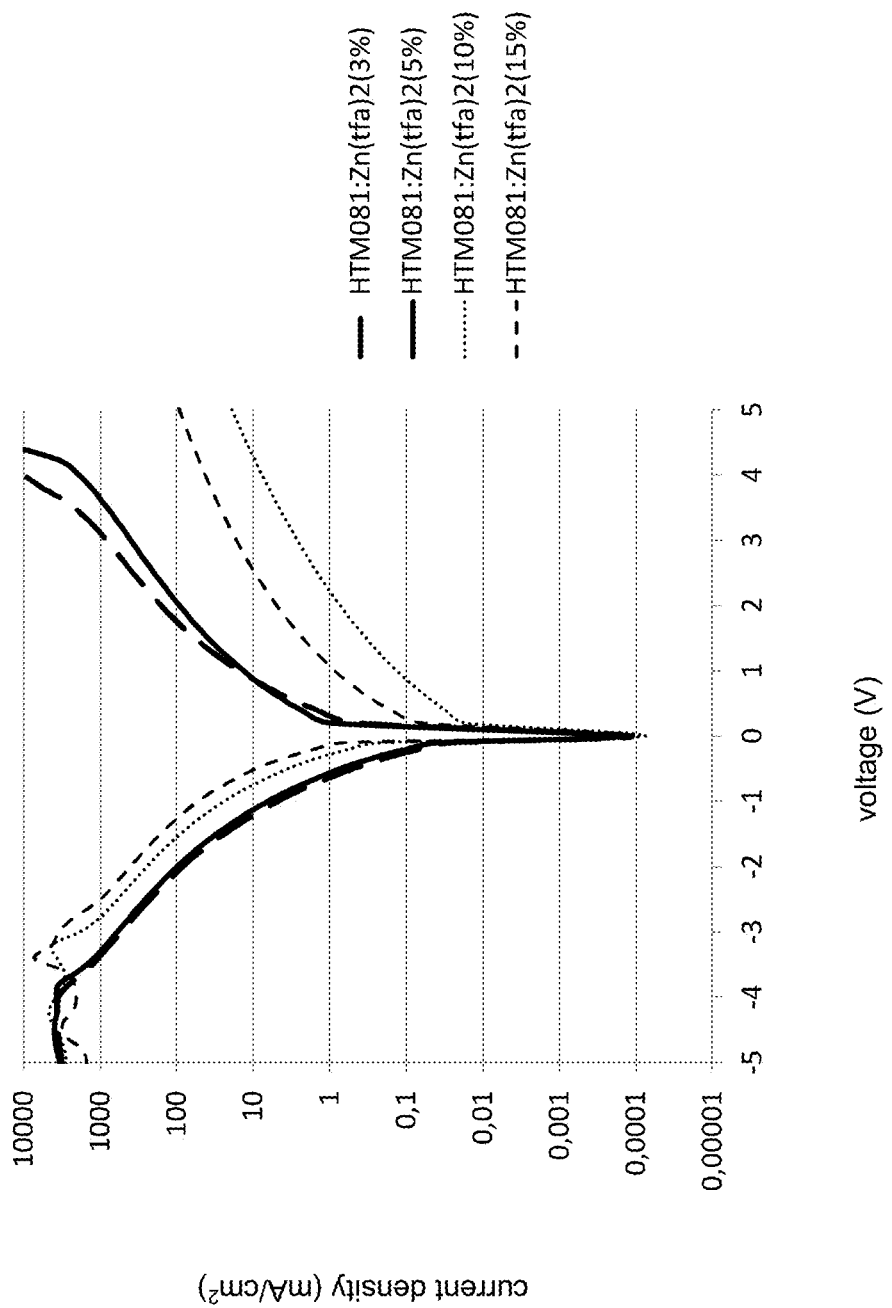

FIG. 12B, for Example IV, Zn(tfa), schematically shows the current density against the voltage. Here, the commercially obtainable matrix material HTM081 from Merck is doped with Zn(tfa). The current-voltage curve here as well shows an excellent p-dopant effect.

FIGS. 12A and 12B illustrate the broad usability and good p-dopant effect of zinc complexes according to the invention for various matrix materials. In addition, different p-dopant concentrations were tested in both cases. Measurements between 3 and 15 vol. % of the p-dopant in the entire p-doped layer are shown in the two graphs. The zinc complexes according to the invention can be used within a very wide range of concentrations in the doped layer. Particularly good values are attained between 1 and 25 vol. % of the zinc complex, wherein the range from 3 to 15 vol. % is more preferred. The latter range is shown in each of the figures. The best values are attained between 5 and 10 vol. % (inclusive) of the zinc complex, in relation to the p-doped organic region or the p-doped organic layer.

Figure 13A:
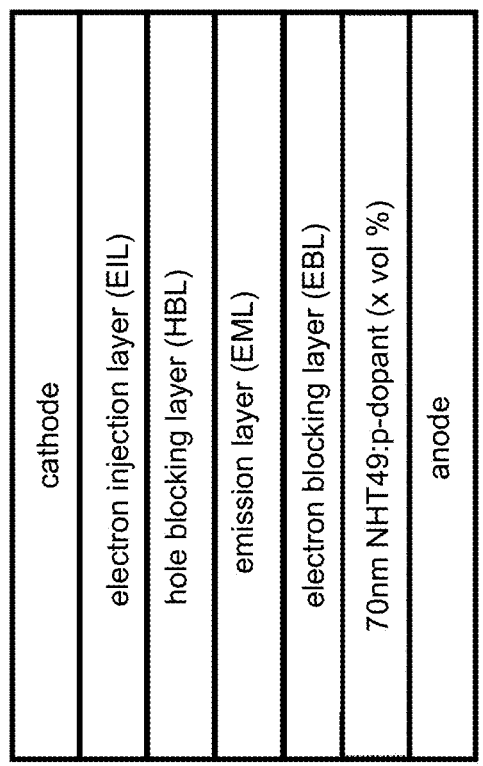
FIG. 13A shows the schematic structure of an embodiment of an organic electronic component designed as organic light-emitting diode.

FIG. 13A shows the schematic structure of an embodiment of an organic electronic component according to the invention, designed as organic light-emitting diode. This is a test arrangement for determining the optoelectronic properties of components comprising a matrix having the zinc complexes according to the invention as p-dopant.

The OLED of FIG. 13A has an anode made of indium tin oxide (ITO) with a thickness of 130 nm. The anode is followed by the hole injection layer, which comprises the zinc complex to be tested as p-dopant. The hole injection layer has a layer thickness of 70 nm. By way of example, the matrix material NHT49 from Novaled was selected as hole conductor matrix of the hole injection layer. Tests for various p-dopant concentrations, specified in volume %, were performed. In addition to the components doped with the zinc complex to be tested, components were also produced which differ merely by the used p-dopant and concentration thereof. The commercially available p-dopant NDP9 from the company Novaled was used as reference p-dopant. The hole injection layer was followed lastly by the electron blocking layer (EBL for short). The emission layer (EML for short), the hole blocking layer (HBL for short), the electron injection layer (EIL for short) and lastly a cathode comprising or consisting of aluminum then follow as further layers of the OLED.

FIG. 13B shows the experimental data obtained by means of measurements on the organic light-emitting diodes presented in FIG. 13A. As comparative example, the widespread, commercially obtainable dopant NDP9 from the company Novaled was used. All further measurements were taken using zinc trifluoroacetate complexes, Zn(tfa), as p-dopant with volume concentrations between 3 and 15 vol. % in relation to the doped layer. In each case, the commercially obtainable hole conducting matrix material NHT49 from Novaled served as matrix material. The measurements were each taken at the same luminance, resulting in a comparable current density and operating voltage for the components doped with the Zn dopant and for the components doped with NDP9. The efficiency variables constituted by light yield (Peff), electricity yield (Ieff) and external quantum yield (EQE) are even higher in the components comprising the zinc complex according to the invention in the concentration range up to 10% with constant colour coordinates Cx and Cy than in the components comprising the reference dopant. The measurements in a conventionally structured test arrangement, corresponding to an organic light-emitting diode, thus confirm the excellent p-dopant effect of the zinc complex according to the invention and the suitability for its use for doping hole conducting matrix materials in organic electronic components. Lastly, the measurements indicate that OLEDs comprising the zinc complexes according to the invention permit improved light yields, electricity yields, and external quantum yields. This can be attributed at least partially to the only very low absorption of layers doped with the zinc complexes. Losses by absorption by the dopant in the component are thus reduced, which has a positive effect particularly in the case of organic electronic components in the field of optoelectronics, such as OLEDs.

Figure 14:
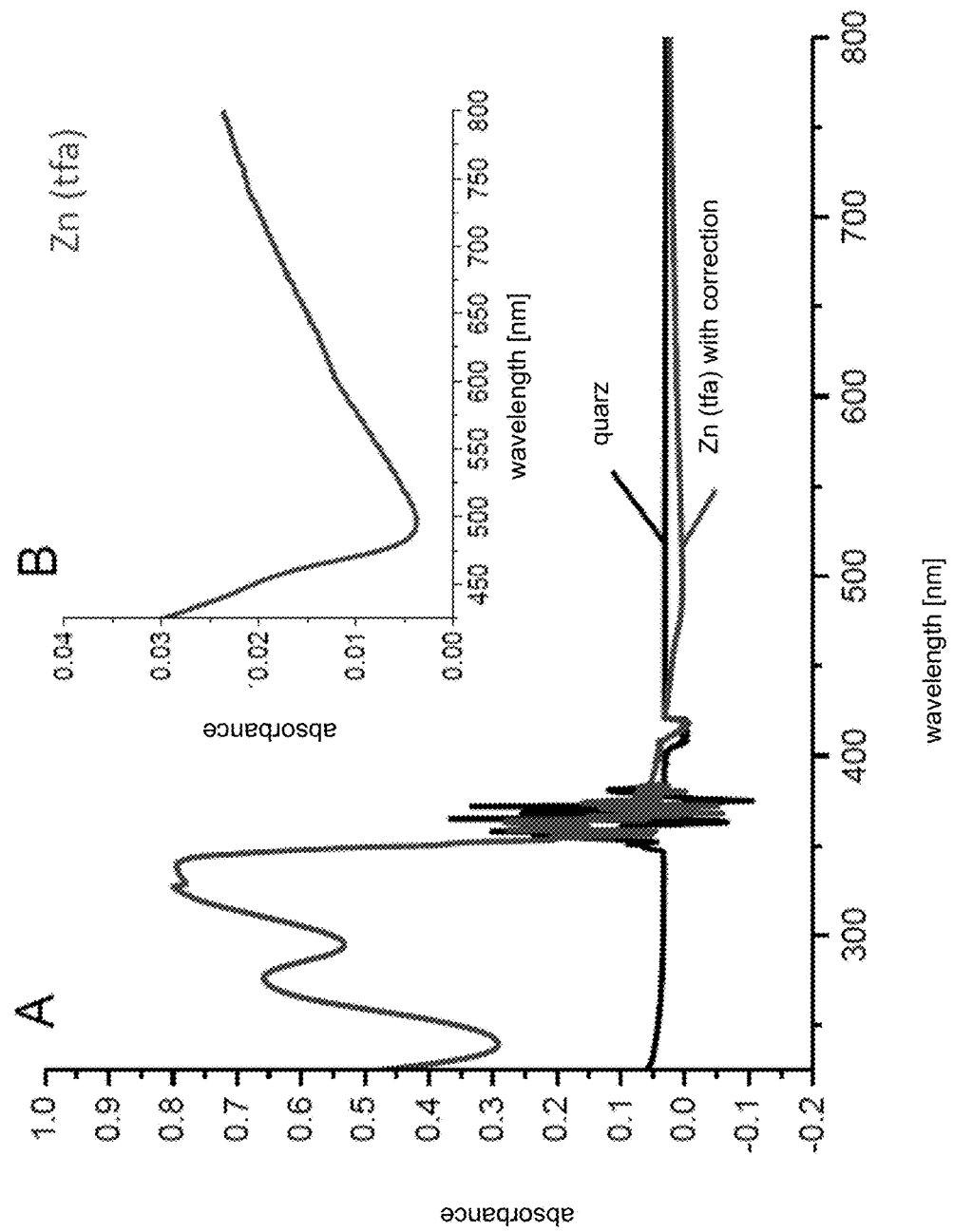
FIG. 14 shows the absorption spectrum of a layer doped with a zinc complex according to embodiments.

FIG. 14 shows the absorption spectrum of a layer doped with a zinc complex according to the invention. FIG. 14A compares the absorption spectrum of quartz, which has an excellent light transmittance, with the absorption behavior of a doped layer of HTM014 200 nm thick, doped with 5% zinc trifluoroacetate. The measurements were taken using a conventional dual beam spectrophotometer. In the range of visible light, i.e., between 400 and 700 nm, the doped layer demonstrates surprisingly low values for the absorbance, which is a measure for absorption. FIG. 14B shows the section between 450 and 800 nm enlarged. Here, it can be seen that in the visible range the absorbance of the doped layer is even less than 0.03, and over wide areas is even less than 0.02. Such a low absorption is achieved only for few materials and shows that the zinc complexes according to the invention are outstandingly suited for optoelectronic devices, such as organic light-emitting diodes or organic solar cells.

The zinc complexes of the organic electrical component according to the invention can be obtained, for example, by reacting di-alkyl zinc or di-aryl zinc with the corresponding carboxylic acids or derivatives thereof. The substitution of the alkyl or aryl ligands of the starting complex of zinc was performed here in a number of steps, wherein the substitution can also be incomplete. This is presented hereinafter in an exemplary manner for a two-stage reaction, which, for example, can also be stopped after the first stage:

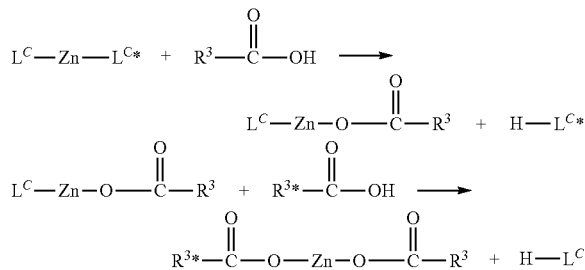

Explanation of the Terms:

LC corresponds here to the previously described ligand $L^C$ and is an alkyl or aryl. $L^{C*}$ independently of $L^C$ is also an alkyl or aryl, wherein $L^C$ and $L^{C*}$ can be the same or different. $R^3$, for the specified exemplary production method, corresponds to the group $R^3$ of the ligand L of the zinc complex according to the invention. The carboxylate comprising $R^3$ consequently corresponds in this example to the ligand L of the finished zinc complex (i.e., $L=R^3COO-$).

It is additionally possible to obtain the mixed aryl/alkyl carboxylates by means of comproportionation:

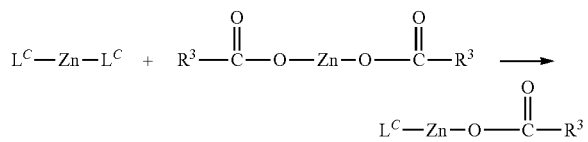

If the substituents $L^C$ are also fluorinated, a class of mixed alkyl/aryl zinc dopants is obtained. The doping strength, volatility and solubility thus can be adjusted not only by the carboxylate ligand $R^3COO-$, but additionally also by the ligand $L^C$ largely independently of the sublimation temperature.

Oligomer structures or clusters are also accessible by the same procedure as the synthesis presented formally here.

EXAMPLE I

Example I relates to a zinc pentafluorobenzoate complex, Zn(pfb), abbreviated hereinafter to Zn3, which was obtained via the synthetic pathway described hereinafter:

30.59 mmol of pentafluorobenzoic acid were dissolved in 80 ml of toluene and cooled to 0° C. 15.29 mmol of diethylzinc solution (15% in toluene) were diluted with 20 mL of toluene, also cooled, and added carefully dropwise under protective gas to the pentafluorobenzoic acid solution. Under stirring, the solution was brought to room temperature. After approximately one hour, a small amount of white precipitate had already formed. The mixture was then stirred for 15 hours at a bath temperature of 50° C. A dense, white precipitate was obtained. The solvent was reduced to a third, and the white product was suctioned off via a P4 frit and was washed three times with cyclohexane and dried in a vacuum. The yield was: 6.11 g (82%); sublimation range: 215-230° C./$10^{-5}$ mbar.

A matrix layer with p-dopant as measured in FIG. 8, for Example I, was obtained by means of co-evaporation of the matrix material and also of the zinc complex. The hole transport layer was thus attained directly from the gas phase by reaction of the components on the substrate.

Here, the layers to be measured were produced as follows
Evaporation

ITO-pre-structured glass substrates were subjected for 10 minutes to an oxygen plasma treatment and were then transferred as quickly as possible into the evaporator. The evaporator was transferred into an argon glovebox, in which the oxygen and water concentration was less than 2 ppm.

All evaporations were performed in a vacuum of less than $2\times10^{-6}$ mbar basic pressure (the pressure then rose with the evaporation)).

Both matrix material and dopant material were first heated to just below the evaporation point, then were heated until constant evaporation could be observed.

The total evaporation rate was approximately 1 Å/s, wherein the evaporation rate of the doping material was set via the evaporation rate of the matrix material.

Once the shutters were closed, the glovebox was cooled to 40° C., flooded with argon, and the mask for the deposition of the cathode was changed, and the glovebox was evacuated again.

The electrode consisted of a layer of aluminum 150 nm thick, which was applied with an initial evaporation rate of 0.5 Å/s, which was increased slowly to 5 Å/s.

The same process was also applied in the following examples (Examples II to IV).

FIGS. 9 to 11 relate to doped and undoped HTM-014 (matrix material, Merck KGaA). Here, layers of undoped HTM-014 (Merck KGaA) were produced on the one hand, and on the other hand HTM-014 doped with 15% of the particular zinc complex were produced, said layers being 200 nm thick in each case.

EXAMPLE II

Example II also relates to the production of a second zinc pentafluorobenzoate complex Zn(pfb) different from Example I, abbreviated to Zn8. 30.59 mmol of pentafluorobenzoic acid were cooled in 60 ml of diethyl ether to 0° C. 15.29 mmol of diethyl zinc solution (1.0 M in hexane) were diluted with 20 ml diethyl ether, also cooled, and were carefully added dropwise under protective gas to the pentafluorobenzoic acid solution. Under stirring, the solution was brought to room temperature. The solution was then stirred for 15 hours at a bath temperature of 30° C. A white precipitate was obtained. The white product was suctioned off via a P4 frit and was washed three times with cyclohexane and dried in a vacuum. The yield was: 5.6 g (75%); sublimation range: 255-270° C./$10^{-5}$ mbar.

The substance obtained by the synthesis procedure presented in Example II surprisingly has a much higher sublimation temperature than the compound as obtained by the method presented in Example I, and it therefore can be assumed that this substance is a complex compound different from the substance obtained in Example I.

EXAMPLE III

Example III relates to the production of a zinc complex with 3,5-bis(trifluoromethyl)benzoate ligand, Zn(3,5-tfmb), also abbreviated to Zn(3,5).

For this purpose, 30.59 mmol of 3,5-(trifluoromethyl) benzoic acid were dissolved in a mixture of 50 ml of toluene and 30 ml of benzene and were cooled to 0° C. 15.29 mmol of diethylzinc solution (15% toluene) diluted with 10 ml toluene, which was also cooled, were added dropwise under protective gas. A jelly-like mass was obtained, which was stirred for 18 hours at a bath temperature of 90° C. A slightly cloudy solution was then produced. The solvent was removed completely under vacuum, leaving a white powder. Yield: 8.39 g (86%); sublimation range: 260-280° C./10$^{-5}$ mbar.

EXAMPLE IV

Example IV relates to the production of a zinc complex with trifluoroacetate ligand, abbreviated to Zn(tfa).

48.16 mmol of trifluoroacetic acid were mixed with 60 mmol benzene and cooled to 10° C. 22.9 mmol of diethylzinc solution (15% in toluene), diluted with 60 ml of benzene, were then added carefully dropwise. The mixture was stirred for 15 hours at room temperature to produce a white precipitate. A third of the solvent was removed, and the white product was suctioned off via a P4 frit and was washed three times with cyclohexane. The yield was: 5.55 g (83%); sublimation range 163-173° C./10$^{-5}$ mbar.

The individual combinations of the constituents and the features of the above-mentioned embodiments are exemplary; the exchange and substitution of these teachings with other teachings contained in this document with the cited documents is also expressly considered. A person skilled in the art will know that variations, modifications, and other embodiments described here can also be provided, without departing from the inventive concept or the scope of the invention.

Accordingly, the above description is exemplary and should not be considered to be limiting. The word "comprise" as used in the claims does not rule out other constituents or steps. The indefinite article "a" does not rule out the meaning of a plural. The mere fact that specific measures are recited in claims different from each other does not mean that a combination of these measures cannot be used to an advantage. The scope of the invention is defined in the following claims and the associated equivalents.

The invention claimed is:

1. An organic electronic component comprising:
   a matrix comprising a zinc complex as a p-dopant, the zinc complex containing a zinc atom in the oxidation state II and at least one ligand L of the following structure:

wherein R$^1$ and R$^2$ are independently from one another selected from the group consisting of oxygen, sulfur, selenium, NH and NR$^4$,
   wherein R$^3$ is selected from the group consisting of alkyl, long-chain alkyl, cycloalkyl, haloalkyl, aryl, arylene, haloaryl, heteroaryl, heteroarylene, heterocycloalkylene, heterocycloalkyl, haloheteroaryl, alkenyl, haloalkenyl, alkinyl, haloalkinyl, ketoaryl, haloketoaryl, ketoheteroaryl, ketoalkyl, haloketoalkyl, ketoalkenyl, haloketoalkenyl, haloalkylaryl and haloalkylheteroaryl,
   wherein one or more non-adjacent CH$^2$ groups are replaceable by —O—, —S—, —NH—, —NR$^{ooo}$—, —SiR$^o$R$^{oo}$—, —CO—, —COO—, —COR$^o$OR$^{oo}$—, —OCO—, —OCO—O—, —SO$_2$—, —S—CO—, —CO—S—, —O—CS—, —CS—O—, —CY$_1$=CY$_2$ or —C≡C— independently from one another in such a way that O and/or S atoms are not directly bonded to one another, and
   O and/or S atoms are replaceable with aryl or heteroaryl containing 1 to 30 C atoms,
   wherein R$^4$ is selected from the group consisting of alkyl and aryl and is bondable to R$^3$,
   wherein the zinc complex comprises at least one of the following structural units:

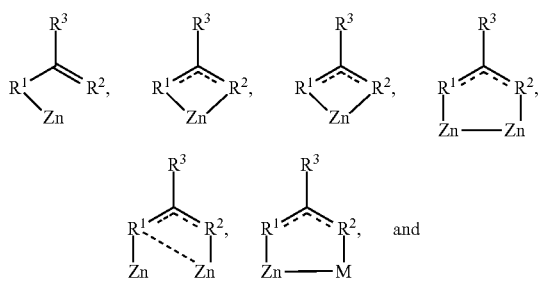

wherein M is a metal atom different from zinc.

2. The component according to claim 1, wherein R$^3$ is selected from the group consisting of haloalkyl, haloaryl, haloheteroaryl, haloalkylaryl and haloalkylheteroaryl, and wherein the halogen is fluorine.

3. The component according to claim 1, wherein R$^3$ is selected from the group consisting of:

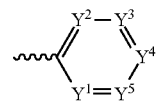

wherein Y$^1$—Y$^5$ are selected independently of one another from the group consisting of C—H, C-D, C—F, C—NO$_2$, C—CN, C-halogen, C-pseudohalogen, N and C—C$_n$F$_{2n+1}$ with n=1 to 10.

4. The component according to claim 1, wherein R$^3$ is selected from the group consisting of:

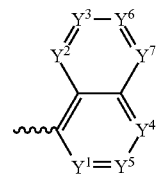

wherein Y$^1$—Y$^7$ are selected independently of one another from the group consisting of C—H, C-D, C—F, C—NO$^2$, C—CN, C-halogen, C-pseudohalogen, N and C—C$^N$F$^{2N}$$^{+1}$ with n=1 to 10.

5. The component according to claim 1, wherein R$^3$ is selected from the group consisting of:

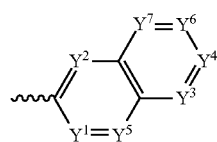

wherein $Y^1$—$Y^7$ are selected independently of one another from the group consisting of C—H, C-D, C—F, C—No$^2$, C—CN, C-halogen, C-pseudohalogen and C—C$^N$F$^{2N+1}$ with n =1 to 10.

6. The component according to claim 1, wherein both $R^1$ and $R^2$ are oxygen.

7. The component according to claim 1, wherein the zinc complex further comprises at least one further ligand $L^C$, which is bonded to zinc via a carbon atom.

8. The component according to claim 7, wherein the at least one ligand $L^C$ is a substituted, unsubstituted, branched, linear or cyclic alkyl, or a substituted, unsubstituted aryl or heteroaryl.

9. The component according to claim 1, wherein zinc has the coordination number 4, 5 or 6.

10. The component according to claim 1, wherein the zinc complex is a trinuclear or pentanuclear metal complex.

11. The component according to claim 1, wherein the zinc complex is a polynuclear metal complex, and wherein the at least one ligand L coordinately bonds two metal atoms.

12. The component according to claim 1, wherein the zinc complex is a polynuclear metal complex comprising at least two ligands L, wherein at least one of the ligands L coordinately bonds two metal atoms, and wherein at least one further ligand L is bonded terminally to a metal center of the zinc complex.

13. The component according to claim 1, wherein the zinc complex comprises at least two zinc atoms.

14. The component according to claim 1, wherein the zinc complex further comprises a metal different from zinc.

15. A method for making an electronic component, the method comprising:
doping a matrix material of the electronic component with a p-dopant, wherein the p-dopant comprises a zinc complex comprising a zinc atom in the oxidation state II and at least one ligand L of the following structure:

wherein $R^1$ and $R^2$ are selected independently from one another from the group consisting of oxygen, sulfur, selenium, NH and NR$^4$,
wherein $R^3$ is selected from the group consisting of alkyl, long-chain alkyl, cycloalkyl, haloalkyl, aryl, arylene, haloaryl, heteroaryl, heteroarylene, heterocycloalkylene, heterocycloalkyl, haloheteroaryl, alkenyl, haloalkenyl, alkinyl, haloalkinyl, ketoaryl, haloketoaryl, ketoheteroaryl, ketoalkyl, haloketoalkyl, ketoalkenyl, haloketoalkenyl, haloalkylaryl and haloalkylheteroaryl,
wherein one or more non-adjacent CH$_2$ groups are replaceable by —O—, —S—, —NH—, —NR$^{ooo}$—, —SiR$^o$R$^{oo}$—, —CO—, —COO—, —COR$^o$ OR$^{oo}$—, —OCO—OCO—O—, —SO$_2$—, —S—CO—, —CO—S—, —O—CS—, —CS—O—, —CY$_1$=CY$_2$— or —C≡C—independently from one another in such a way that O and/or S atoms are not directly bonded to one another, and
O and/or S atoms are replaceable with aryl or heteroaryl containing 1 to 30 C atoms,
wherein $R^4$ is selected from the group consisting of alkyl and aryl and are bondable to $R^3$,
wherein the zinc complex comprises at least one of the following structural units:

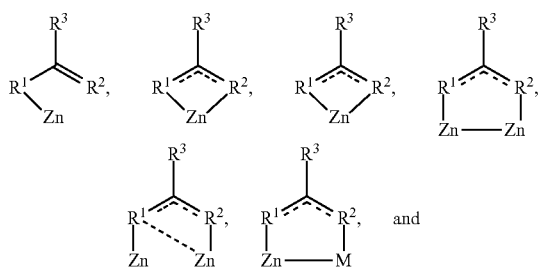

wherein M is a metal atom different from zinc.

16. The method according to claim 15, wherein the zinc complex is a mononuclear or a polynuclear complex and comprises a zinc atom in the oxidation stage II, and wherein the mononuclear zinc complex comprises the following structural unit:

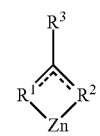

or the polynuclear zinc complex comprises one of the following structural units:

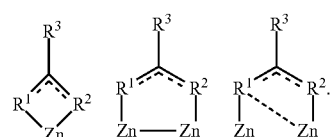

17. An organic electronic component comprising:
a matrix comprising a mononuclear or a polynuclear zinc complex as a p-dopant, the zinc complex comprises a zinc atom in the oxidation state II and contains at least one ligand L of the following structure:

wherein $R^1$ and $R^2$ are selected independently from one another from the group consisting of oxygen, sulfur, selenium, NH and NR$^4$,
wherein $R^3$ is selected from the group consisting of alkyl, long-chain alkyl, cycloalkyl, haloalkyl, aryl, arylene, haloaryl, heteroaryl, heteroarylene, heterocycloalkylene, heterocycloalkyl, haloheteroaryl, alkenyl, haloalkenyl, alkinyl, haloalkinyl, ketoaryl, haloketoaryl, ketoheteroaryl, ketoalkyl, haloketoalkyl, ketoalkenyl, haloketoalkenyl, haloalkylaryl and haloalkylheteroaryl, wherein one or more non-adjacent CH$_2$ groups are replaceable by —O—, —S—, —NH—, —NR$^{ooo}$—, —SiR$^o$R$^{oo}$—, —CO—, —COO—, —COR$^o$OR$^{oo}$—, —OCO—, —OCO—O—, —SO$_2$—, —S—CO—, —CO—S—, —O—CS—, —CS—O—, —CY$_1$=CY$_2$ or —C≡C— independently from one another in such a way that O and/or S atoms are not directly bonded to one another, and O and/or S atoms are replaceable with aryl or heteroaryl containing 1 to 30 C atoms, wherein R$^4$ is selected from the group consisting of alkyl and aryl and is bondable to R$^3$, and wherein the mononuclear zinc complex comprises the following structural unit:

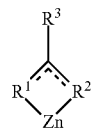

or the polynuclear zinc complex comprises one of the following structural units:

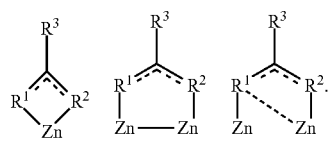

* * * * *

UNITED STATES PATENT AND TRADEMARK OFFICE
CERTIFICATE OF CORRECTION

PATENT NO. : 10,256,422 B2  
APPLICATION NO. : 15/515858  
DATED : April 9, 2019  
INVENTOR(S) : Schmid Page 1 of 1

It is certified that error appears in the above-identified patent and that said Letters Patent is hereby corrected as shown below:

In the Claims

In Column 26, Line 63, Claim 4, delete "C-NO$^2$" and insert --C-NO$_2$--.

In Column 26, Line 64, Claim 4, delete "C-C$^N$F$^{2N+1}$" and insert --C-C$_n$F$_{2n+1}$--.

In Column 27, Line 10, Claim 5, delete "C-No$^2$" and insert --C-NO$_2$--.

In Column 27, Line 11, Claim 5, delete "C-C$^N$F$^{2N+1}$" and insert --C-C$_n$F$_{2n+1}$--.

In Column 27, Lines 64-67, Claim 15, delete "replaceable by -O-, -S-, -NH-, -NR$^{ooo}$-, -SiR$^o$R$^{oo}$-, -CO-, -COO-, -COR$^o$OR$^{oo}$-, -OCO---OCO-O-, -SO$_2$-, -S-CO-, -CO-S-, -O-CS-, -CS-O-, -CY$_1$=CY$_2$" and insert --replaceable by -O-, -S-, -NH-, -NR$^{ooo}$-, -SiR$^o$R$^{oo}$-, -CO-, -COO-, -COR$^o$OR$^{oo}$-, -OCO-, -OCO-O-, -SO$_2$-, -S-CO-, -CO-S-, -O-CS-, -CS-O-, -CY1=CY2--.

Signed and Sealed this  
Sixteenth Day of July, 2019

Andrei Iancu  
*Director of the United States Patent and Trademark Office*